(12) United States Patent
Sakui

(10) Patent No.: US 9,583,154 B2
(45) Date of Patent: Feb. 28, 2017

(54) METHODS AND APPARATUSES INCLUDING A STRING OF MEMORY CELLS HAVING A FIRST SELECT TRANSISTOR COUPLED TO A SECOND SELECT TRANSISTOR

(71) Applicant: Micron Technology, Inc., Boise, ID (US)

(72) Inventor: Koji Sakui, Setagayaku (JP)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 15/131,671

(22) Filed: Apr. 18, 2016

(65) Prior Publication Data

US 2016/0232947 A1    Aug. 11, 2016

Related U.S. Application Data

(63) Continuation of application No. 14/456,222, filed on Aug. 11, 2014, now Pat. No. 9,318,200.

(51) Int. Cl.
*G11C 16/04* (2006.01)
*G11C 5/06* (2006.01)
(Continued)

(52) U.S. Cl.
CPC ............ *G11C 5/06* (2013.01); *G11C 5/144* (2013.01); *G11C 16/0483* (2013.01);
(Continued)

(58) Field of Classification Search
CPC ....... H01L 2924/0002; H01L 27/11582; H01L 27/11556; H01L 2924/00; H01L 27/11565;
(Continued)

(56) References Cited

U.S. PATENT DOCUMENTS 7,141,474 B2   11/2006  Ichige et al.
7,196,930 B2    3/2007  Han et al.
(Continued)

OTHER PUBLICATIONS

Komori, Yosuke, et al., "Disturbless Flash Memory due to High Boost Efficiency on BiCS Structure and Optimal Memory Film Stack for Ultra High Density Storage Device", International Electron Devices Meeting Technical Digest, (Dec. 2008), 851-854.

*Primary Examiner* — Thong Q Le
(74) *Attorney, Agent, or Firm* — Schwegman Lundberg & Woessner, P.A.

(57) ABSTRACT

Generally discussed herein are apparatuses and methods. One such apparatus includes a data line, a first memory cell and a first select transistor. The first transistor has a gate and is coupled between the data line and the first memory cell. The apparatus can include a second memory cell and a second select transistor having a gate. The apparatus can include a third select transistor having a gate. The second select transistor is coupled between the second memory cell and the third select transistor. The third select transistor is coupled between the second select transistor and a source. The apparatus can include a drive transistor coupled to both the gate of the first select transistor and the gate of the second select transistor or the gate of the third select transistor.

20 Claims, 20 Drawing Sheets

(51) Int. Cl.
*G11C 16/10* (2006.01)
*G11C 16/26* (2006.01)
*G11C 16/08* (2006.01)
*G11C 5/14* (2006.01)

(52) U.S. Cl.
CPC .............. *G11C 16/08* (2013.01); *G11C 16/10* (2013.01); *G11C 16/26* (2013.01)

(58) Field of Classification Search
CPC ............ H01L 27/1157; H01L 29/7926; H01L 27/11524; H01L 29/66833; H01L 27/11519; H01L 27/11573; H01L 29/66825; H01L 27/11521; H01L 27/11551
USPC ............ 365/185.29, 185.18, 185.05, 185.11, 365/185.17, 185.33, 174, 185.23, 185.28, 365/189.16, 189.17
See application file for complete search history.

(56) References Cited

U.S. PATENT DOCUMENTS

| | | |
|---|---|---|
| 7,440,321 B2 | 10/2008 | Aritome |
| 9,318,200 B2 | 4/2016 | Sakui |
| 2004/0152262 A1 | 8/2004 | Ichige et al. |
| 2009/0310425 A1* | 12/2009 | Sim .................. H01L 27/11526 365/185.29 |
| 2013/0044549 A1 | 2/2013 | Goda |
| 2013/0258745 A1 | 10/2013 | Tanzawa |
| 2014/0036590 A1 | 2/2014 | Feeley et al. |
| 2016/0042791 A1 | 2/2016 | Sakui et al. |

* cited by examiner

1100

MEMORY STRING

| 0 | 1 | 2 | 3 |
|---|---|---|---|
| DT1 | DT0 | DT1 | DT0 |
| DT2 | DT2 | DT3 | DT3 |
| DT4 | DT4 | DT4 | DT4 |

METHODS AND APPARATUSES INCLUDING A STRING OF MEMORY CELLS HAVING A FIRST SELECT TRANSISTOR COUPLED TO A SECOND SELECT TRANSISTOR

BACKGROUND

The semiconductor industry has a market driven need to reduce the size of devices, such as transistors, and reduce the number of devices for a given apparatus. Some product goals include lower power consumption, higher performance, and smaller sizes. Various memory architectures have been proposed to decrease the power consumption in a memory device, some of which may sacrifice power consumed during a read or write operation or overall size of an apparatus for a reduced leakage current.

DETAILED DESCRIPTION

A conventional 3D NAND memory architecture includes a string of memory cells formed along a polysilicon pillar between a first select transistor (e.g., a Select Gate (SG) transistor sometimes referred to as an SG Drain (SGD) transistor) and a second select transistor (e.g., an SG transistor sometimes referred to as an SG Source (SGS) transistor). The leakage current of the SGD transistor is relatively high and is not significantly reduced during a read operation. This leakage current can increase with temperature. According to at least one embodiment disclosed herein, a string that includes at least two SGS transistors can be used to suppress such a leakage current. For example, two SGS transistors can be coupled between a source (e.g., a source plate, source node, source line, source region, source layer, etc.) and a memory cell of the string. A drive transistor coupled to one of the two SGS transistors can be the same drive transistor that drives an SGD transistor, so as to reduce the number of drive transistors required to drive the SG transistors of the memory array.

Note that as used herein, a gate is a part of a transistor. A CG is a control gate that is a part of a memory cell and an SG is a control gate that is part of a select transistor. The memory cell can include a data storage structure, such as a charge storage structure (e.g., a floating gate and/or a charge trap) or variable resistance structure, for example. Generally, a select transistor that is coupled between a source and a memory cell is considered an SGS transistor and a select transistor that is coupled between a data line and a memory cell is considered an SGD transistor. As used herein, both an SGS transistor and an SGD transistor are referred to as a select transistor. For memory cells including a charge storage structure, the charge stored on the charge storage structure represents at least a portion of a bit of stored data. The SGD transistor typically does not include a charge storage structure, but embodiments are not limited thereto. In a double SGS memory architecture, one SGS transistor can include a charge storage structure and the other SGS transistor might not include a charge storage structures. However, both SGS transistors can include or not include charge storage structures.

Figure 1:
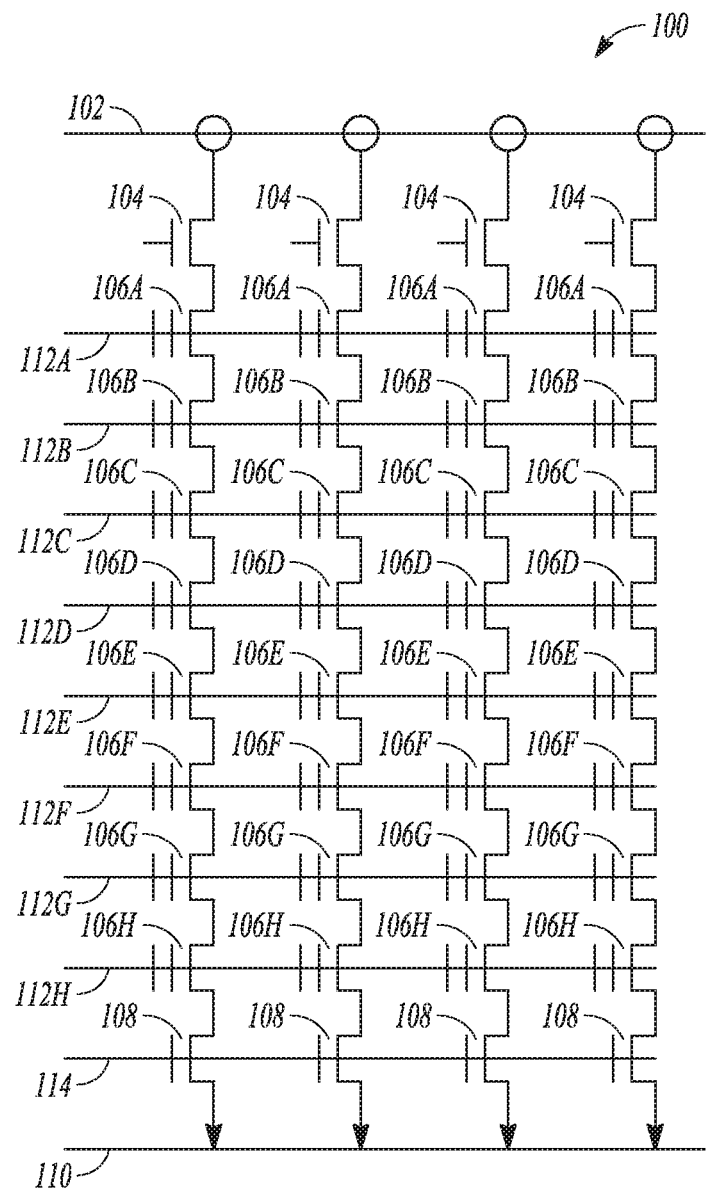
FIG. 1 shows a circuit diagram of a prior art memory array.

FIG. 1 shows a circuit diagram of an example of a prior art memory array 100. The array 100 includes a data line 102, a plurality of select transistors 104, a plurality of memory cells 106A, 106B, 106C, 106D, 106E, 106F, 106G, and 106H, a plurality of select transistors 108, and a source 110.

Each of the SGD select transistors 104 is coupled between a memory cell 106A and a data line 102. Each of the SGD select transistors 104 is coupled to a respective drive transistor (not shown in FIG. 1). The drive transistor is typically large (on the order of about one hundred time larger than the select transistor 104) and takes a relatively large amount of space in a corresponding apparatus.

Each memory cell 106A-H can be coupled to other memory cells on the same tier, such as through a CG connection 112A, 112B, 112C, 112D, 112E, 112F, 112G, or 112H, respectively. In FIG. 1, each memory cell 106A is on the same tier as all other memory cells 106A Similarly, all memory cells 106B are on the same tier, and so forth.

Each of the SGS select transistors 108 is coupled to the other select transistors 108 on the same tier, such as through the SGS connection 114. The SGS select transistors 108 are coupled between a respective memory cell 106H and the source 110.

In performing a read operation using a memory array such as memory array 100, gates of the unselected SGD select transistors 104 are driven to a reference voltage (e.g., zero volts or ground, such as $V_{ss}$), while gates of a selected SGD select transistor 104 and the SGS select transistor 108 are driven to a higher voltage, such as $V_{cc}$, and the source 110 is driven to a reference voltage, such as $V_{ss}$. In this state, leakage current may flow through any unselected SGD select transistors 104 towards the source 110. The potential on the data line 102 is often used to identify the value of the data stored in the memory cell that is being read. For example, for a single level cell, a $V_{cc}$ potential on the data line 102 might indicate that the memory cell stores a data value of "0" and a $V_{ss}$ potential on the data line 102 might indicate that the memory cell stores a data value of "1".

Figure 2A:
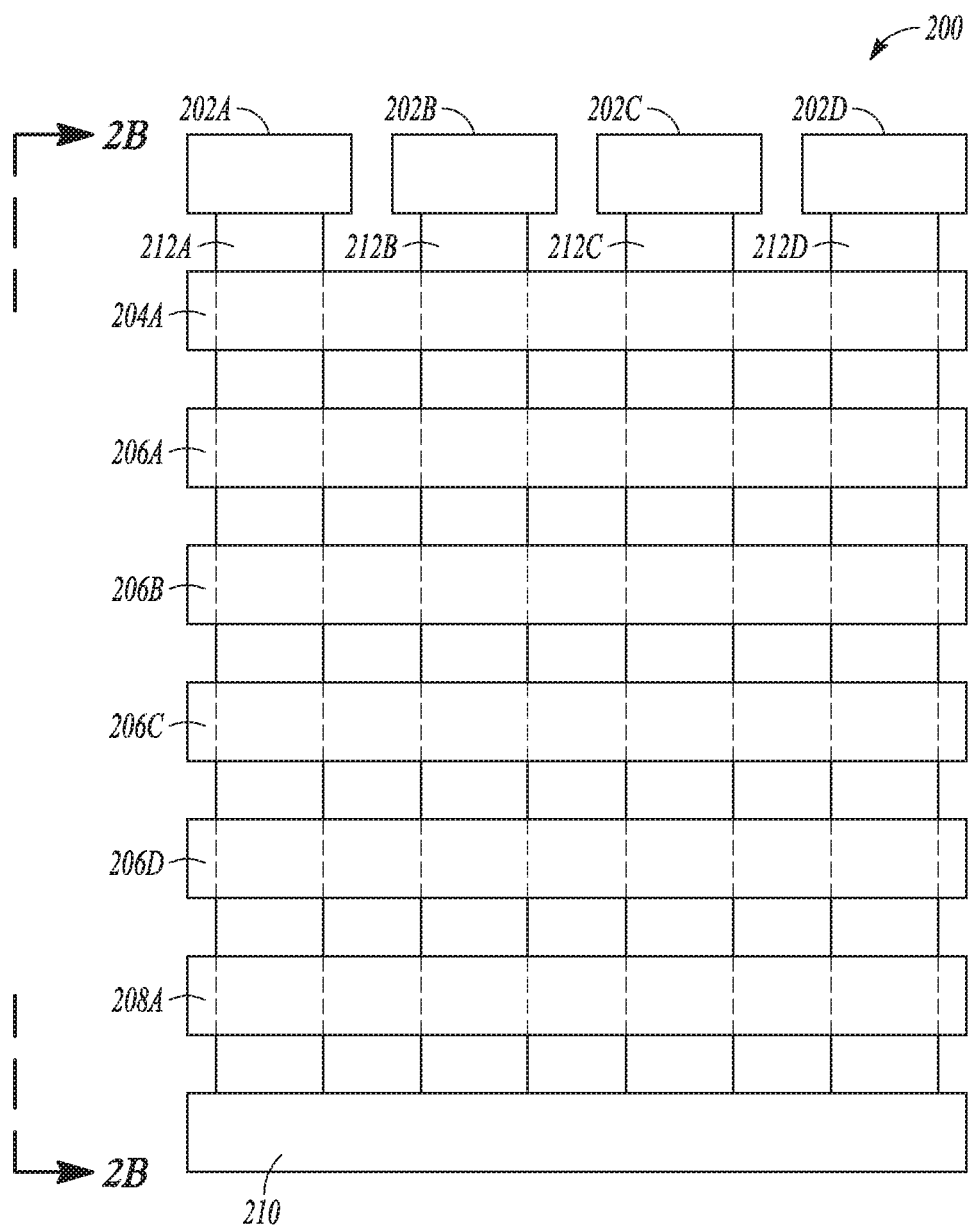
FIG. 2A shows a planar view block diagram of a prior art memory array.
Figure 2B:
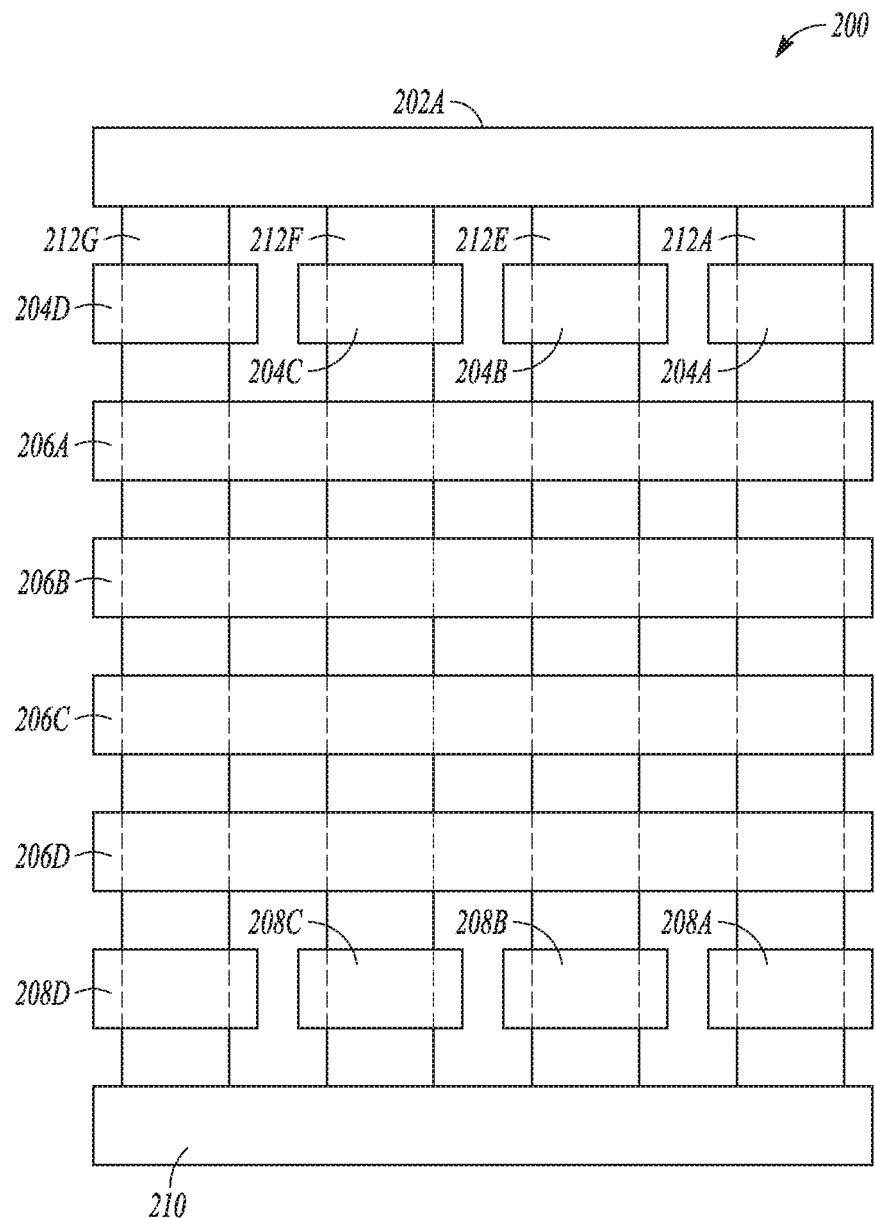
FIG. 2B shows a planar view block diagram of the prior art memory array of FIG. 2A from the direction indicated by the lines 2B-2B in FIG. 2A.

FIG. 2A shows a planar view block diagram of a prior art memory array 200. FIG. 2B shows a planar view block diagram of the prior art memory array 200 of FIG. 2A. The memory array 200 includes data lines 202A, 202B, 202C, and 202D, SGD connections 204A, 204B, 204C, and 204D (which are sometimes referred to as "drain select lines"), CG connections 206A, 206B, 206C, and 206D (which are sometimes referred to as "word lines"), SGS connections 208A, 208B, 208C, and 208D (which are sometimes referred to as "source select lines"), a source 210, and pillars 212A, 212B, 212C, 212D, 212E, 212F and 212G. The memory array 200 can be similar to memory array 100, but with separate SGS connections 208A-D (electrically insulated from each other), such that a separate drive transistor is required to drive each SGS connection 208A-D.

Figure 13A:
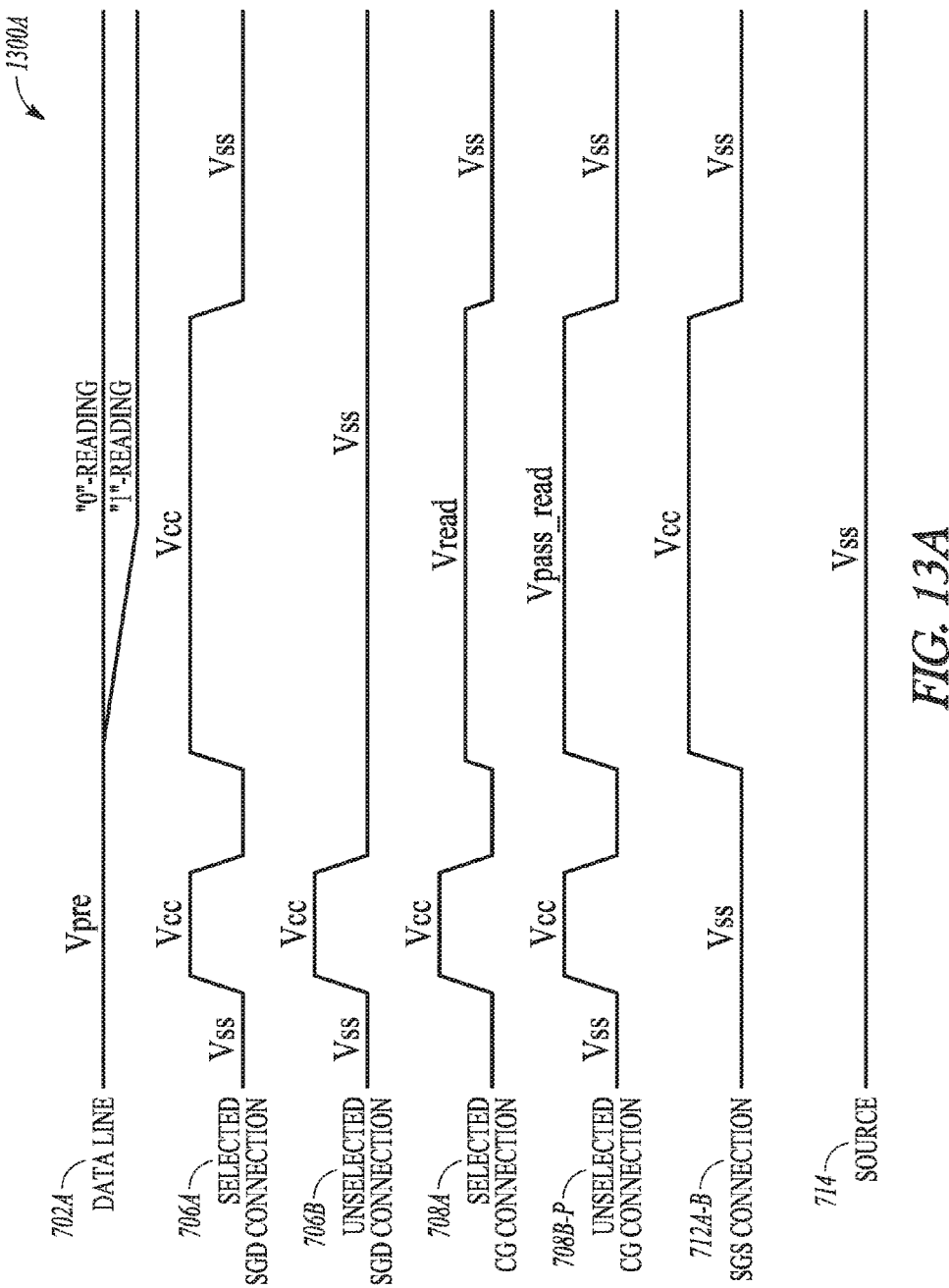
FIG. 13A shows a waveform of a read operation, in accord with one or more embodiments.
Figure 13B:
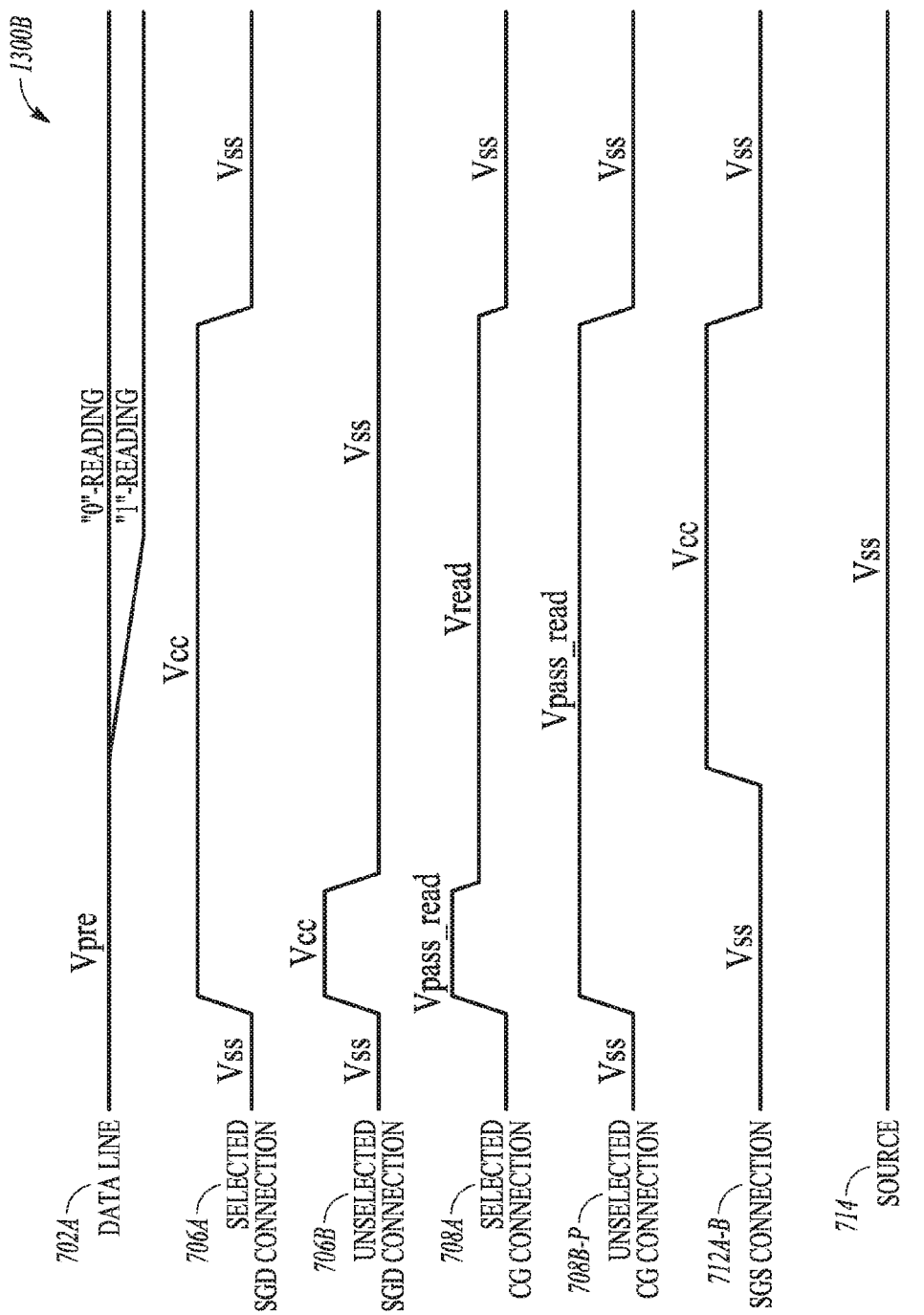
FIG. 13B shows a waveform of another read operation, in accord with one or more embodiments.

The memory array 200 can provide a structure that allows an SGS connection 208A-D to control access to channels in unselected pillars 212A-D and provide the ability to make the unselected channels float. In this manner, the unselected channels can be boosted by a capacitive coupling between the CG connections and the floating channels, such as when a $V_{pass\_read}$ or $V_{read}$ voltage is applied to the CG connections as shown in FIG. 13A or 13B. The floating unselected channel voltages can suppress the electric field in a tunnel oxide between the respective unselected channel and the storage structures so that the electric field is sufficiently small. This floating voltage and small electric field can suppress a Fowler-Nordheim tunnel current for the unselected pillars when reading. Thus, the read disturbance for unselected memory cells of the unselected pillars can be reduced, and the cell threshold voltages can remain relatively unchanged on reading, and the read disturbance can be reduced. However, this added flexibility in driving the SG connections 204A-D and 208A-D individually requires a drive transistor for each, individual SG connection 204A-D and 208A-D.

The added drive transistors take up a relatively large amount of space and can draw more power than select transistors or memory cells. The drive transistors are typically driven to a potential of about twenty volts, such as during a program operation, so the size of the drive transistors can be relatively large when compared to a select transistor that is typically driven to about seven or eight volts during a read or program operation. A memory array that operates with such additional drive transistors also can consume more power than a memory array that operates with fewer drive transistors. Thus, the leakage current and read disturbance can be reduced, but at the expense of more space and possibly an increase in overall power consumption.

Figure 3A:
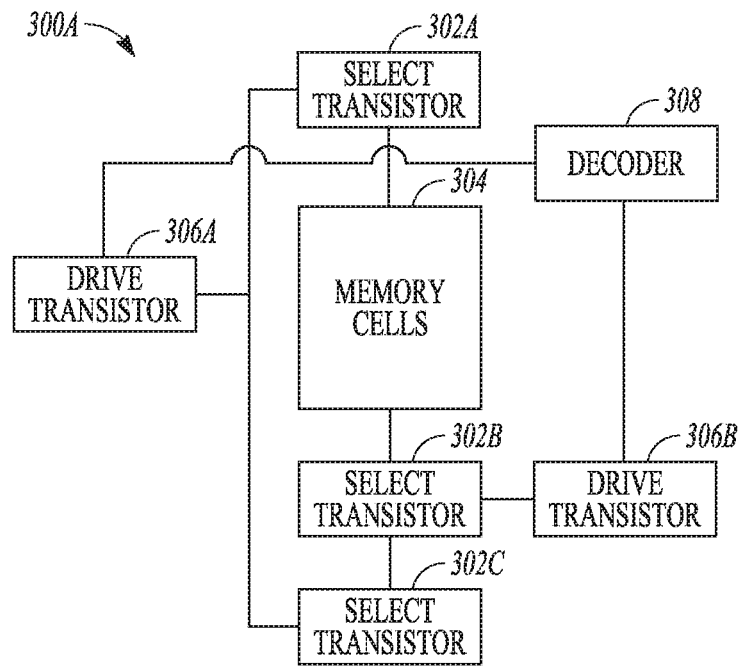
FIG. 3A shows a block diagram of a memory array, in accord with one or more embodiments.
Figure 3B:
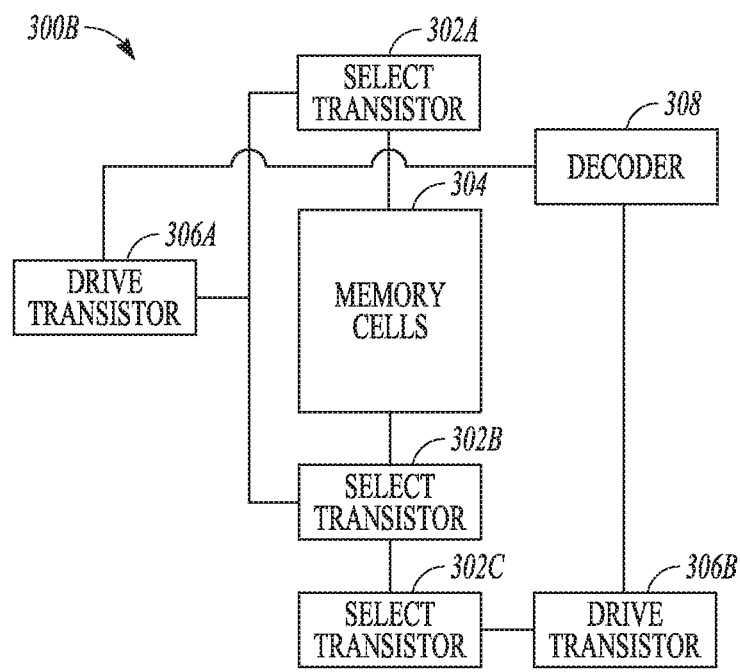
FIG. 3B shows a block diagram of an example of another memory array, in accord with one or more embodiments.

FIG. 3A shows a block diagram of an example of a memory array 300A, in accord with one or more embodiments. FIG. 3B shows a block diagram of an example of a memory array 300B, in accord with one or more embodiments. The memory arrays 300A and 300B each include a plurality of select transistors 302A, 302B, and 302C, memory cells 304, drive transistors 306A and 306B, and a decoder 308.

A string of the memory arrays 300A and 300B includes a plurality of select transistors 302A, 302B, and 302C coupled to each other, such as through a plurality of memory cells 304. The select transistor 302A at a first end of the string can be coupled to one of the memory cells 304. The select transistor 302A can also be coupled to a data line of the memory array (data line not shown in FIG. 3A or 3B). The memory array 300 can include a plurality of memory cells 304 coupled in series, such as shown in FIG. 5, 6, 8, or 10.

A select transistor 302B can be coupled between a memory cell of the plurality of memory cells 304 and the select transistor 302C. The select transistor 302C can be coupled between the select transistor 302B and the source (the source is not shown in FIG. 3A or 3B).

A drive transistor 306A can be coupled to both the select transistor 302A and the select transistor 302C, such as shown in FIG. 3A. Alternatively, a drive transistor 306A can be coupled to both the select transistor 302A and the select transistor 302B, such as shown in FIG. 3B. A decoder 308 can include circuitry to determine which drive transistors to activate to access a targeted string of a plurality of strings, such as in a read operation or a program operation (see FIG. 11 for an example of decoder logic).

An advantage of the memory array 300A or 300B can include the ability to program a specific memory cell while still maintaining the flexibility to selectively boost or precharge any of the channels of the memory array. This advantage can be provided without an increase in the number of drive transistors over the number of drive transistors required to drive the memory array 200 of FIG. 2. The advantage can be provided by including a second select transistor 302B or 302C coupled between the source and the memory cells 304 and coupling the select transistor 302B or 302C to the select transistor 302A and the drive transistor 306A. In this way, the leakage current and read disturbance from performing the read operation, as described with regard to FIG. 1, can be reduced, while still maintaining flexibility in selecting or unselecting the select transistors 302A-C. The leakage current or read disturbance can be reduced by, for example, driving unselected transistors to cut-off unselected channels in a selected block of memory cells.

Figure 4A:
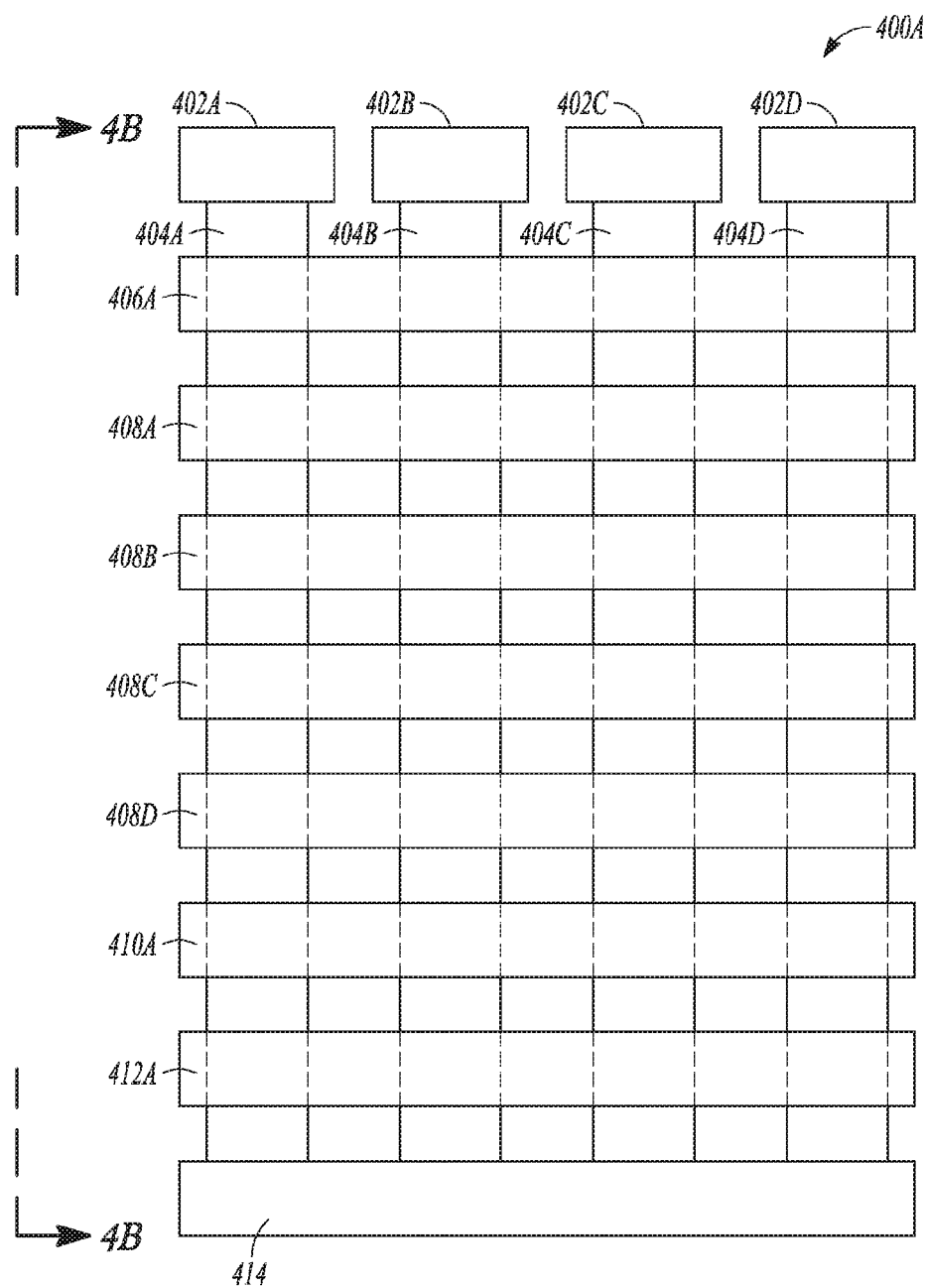
FIG. 4A shows a planar view block diagram of a memory array, in accord with one or more embodiments.
Figure 4B:
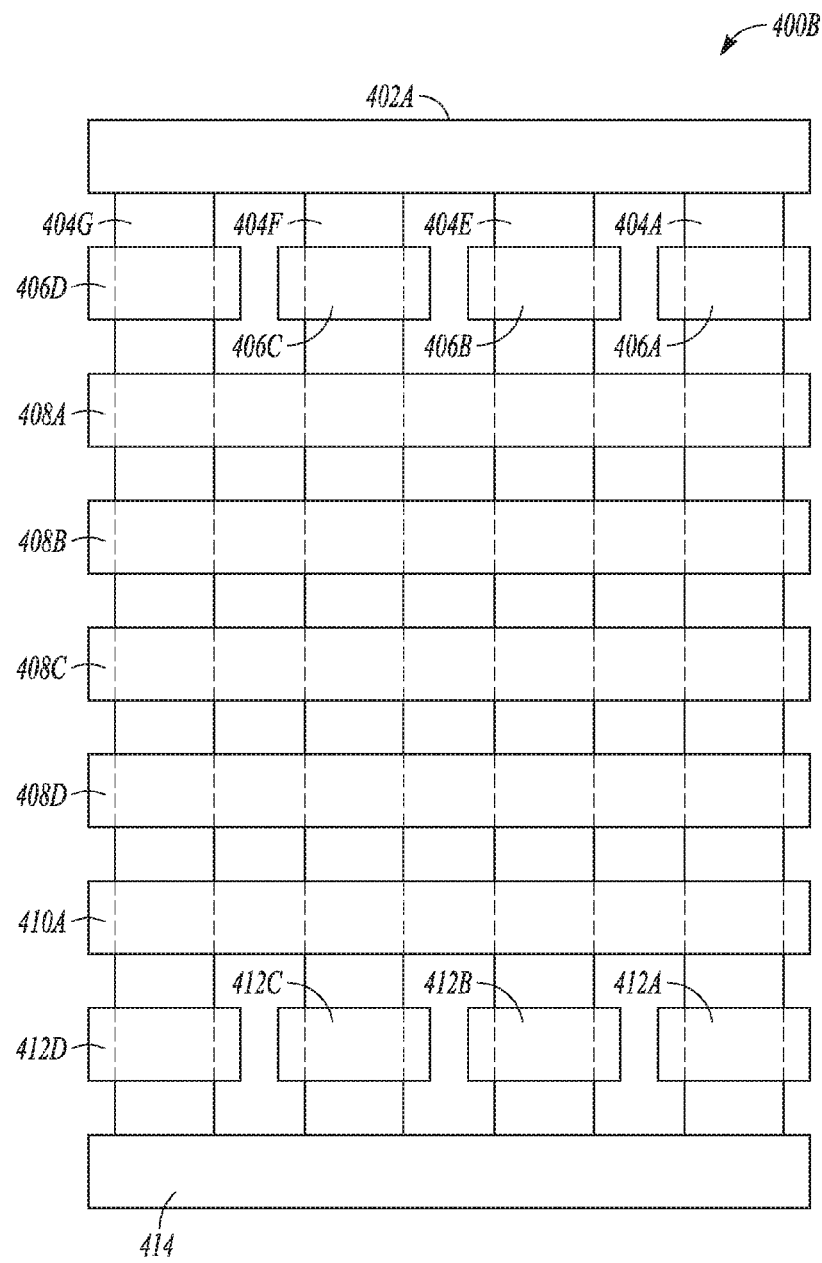
FIG. 4B shows a planar view block diagram of the memory array of FIG. 4A from the direction indicated by the lines 4B-4B in FIG. 4A, in accord with one or more embodiments.
Figure 4C:
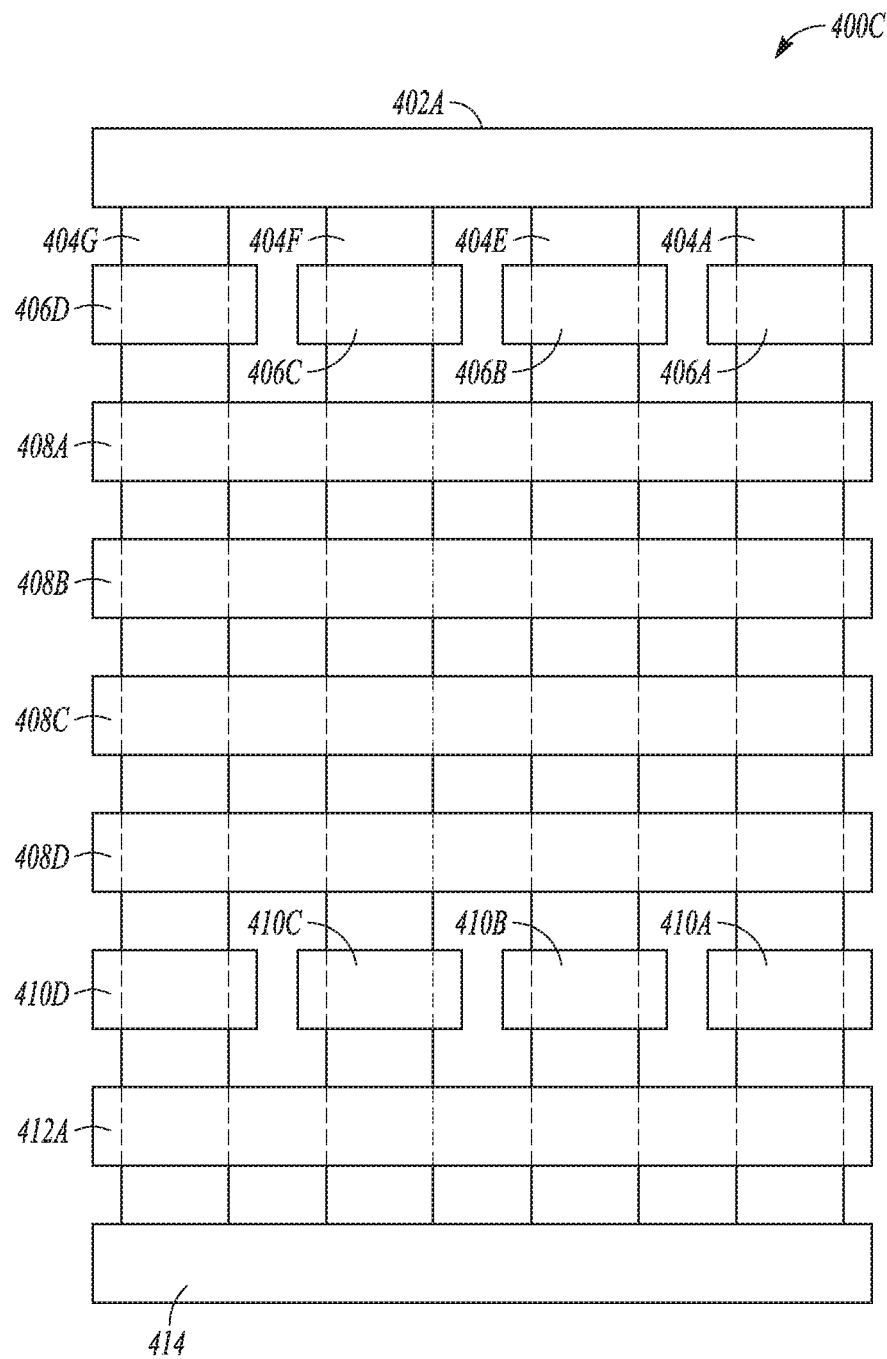
FIG. 4C shows a planar view block diagram of the memory array of FIG. 4A from the direction indicated by the lines 4B-4B in FIG. 4A, in accord with one or more embodiments.

FIG. 4A shows a planar view block diagram of a memory array 400A, in accord with one or more embodiments. FIG. 4B shows a planar view block diagram of an embodiment of the memory array 400A of FIG. 4A. FIG. 4C shows a planar view block diagram of a memory array 400C, that is an alternative embodiment of the memory array 400A of FIG. 4A, in accord with one or more embodiments. The memory array 400A includes a plurality of data lines 402A, 402B, 402C, and 402D, pillars 404A, 404B, 404C, 404D, 404E, 404F and 404G, SGD connections 406A, 406B, 406C, and 406D, CG connections 408A, 408B, 408C, and 408D, SGS connections 410A or 410A, 410B, 410C, and 410D, SGS connections 412A or 412A, 412B, 412C, and 412D, and a source 414.

The embodiment of memory array 400A or 400B includes a plurality of strings of memory cells. Each string of the memory array 400A or 400B includes a select transistor coupled to a respective one of the SGD connections 406A-D, a plurality of memory cells coupled to CG connections 408A-D, a select transistor coupled to SGS connection 410A, and a select transistor coupled to a respective one of the SGS connections 412A-D. The SGS connection 410A can represent a plurality of SGS connections electrically connected to each other, such as to form an SGS plate. The strings of FIGS. 4A and 4B are arranged in a vertical string configuration.

The embodiment of the memory array 400A or 400C includes a plurality of strings of memory cells. Each string of the memory array 400A or 400C includes a select transistor coupled to a respective one of the SGD connections 406A-D, a plurality of memory cells coupled to CG connections 408A-D, a select transistor coupled to a respective one of the SGS connections 410A-D, and a select transistor coupled to SGS connection 412A. The SGS connection 412A can represent a plurality of SGS connections electrically connected to each other so as to form an SGS plate. The strings of memory cells of FIG. 4C are arranged in a vertical string configuration.

The data lines 402A-D can include a conductive material, such as metal or a semiconductor (e.g., a doped semiconductor, such as conductively doped polysilicon). The data lines 402A-D can be coupled to pillars 404A-G through SGD select transistors. The pillars 404A-G can be driven to selectively activate a particular string for reading or programming. The pillars 404A-G can include a semiconductor material, such as polysilicon, germanium, indium, doped versions thereof, or combinations thereof, among others.

The SGD connections 406A-D can be electrically isolated from one another, such as by an electric insulator (e.g., a dielectric or an air gap). The SGD connections 406A-D can include a conductive material, such as a conductively doped semiconductor material. The SGD connections 406A-D can be separated from the pillar 404A-G by one or more dielectric materials, such as an oxide, to form SGD select transistors.

The CG connections 408A-D can include a conductive material, such as a conductively doped semiconductor material. The CG connections 408A-D can each comprise a plurality of CG connections. A CG connection 408A-D can be separated from a pillar 404A-D by one or more dielectric and/or semiconductor materials to form a memory cell, such as one including a charge storage structure. For example, conductively doped polysilicon between a CG connection and the pillar (and separated from the CG connection and the pillar by one or more dielectric materials) can store a charge thereon.

The memory array 400A or 400B includes two tiers of SGS connections 410A and 412A-D between the CG connections 408A-D and the source 414. Each SGS connection 412A-D can be coupled to a respective SGD connection 406A-D (electrical coupling not shown in FIGS. 4A and 4B).

The memory array 400A or 400C includes two tiers of SGS connections 410A-D and 412A between the CG connections 408A-D and the source 414. Each SGS connection 410A-D can be coupled to a respective SGD connection 406A-D (electrical coupling not shown in FIGS. 4A and 4C).

Figure 5:
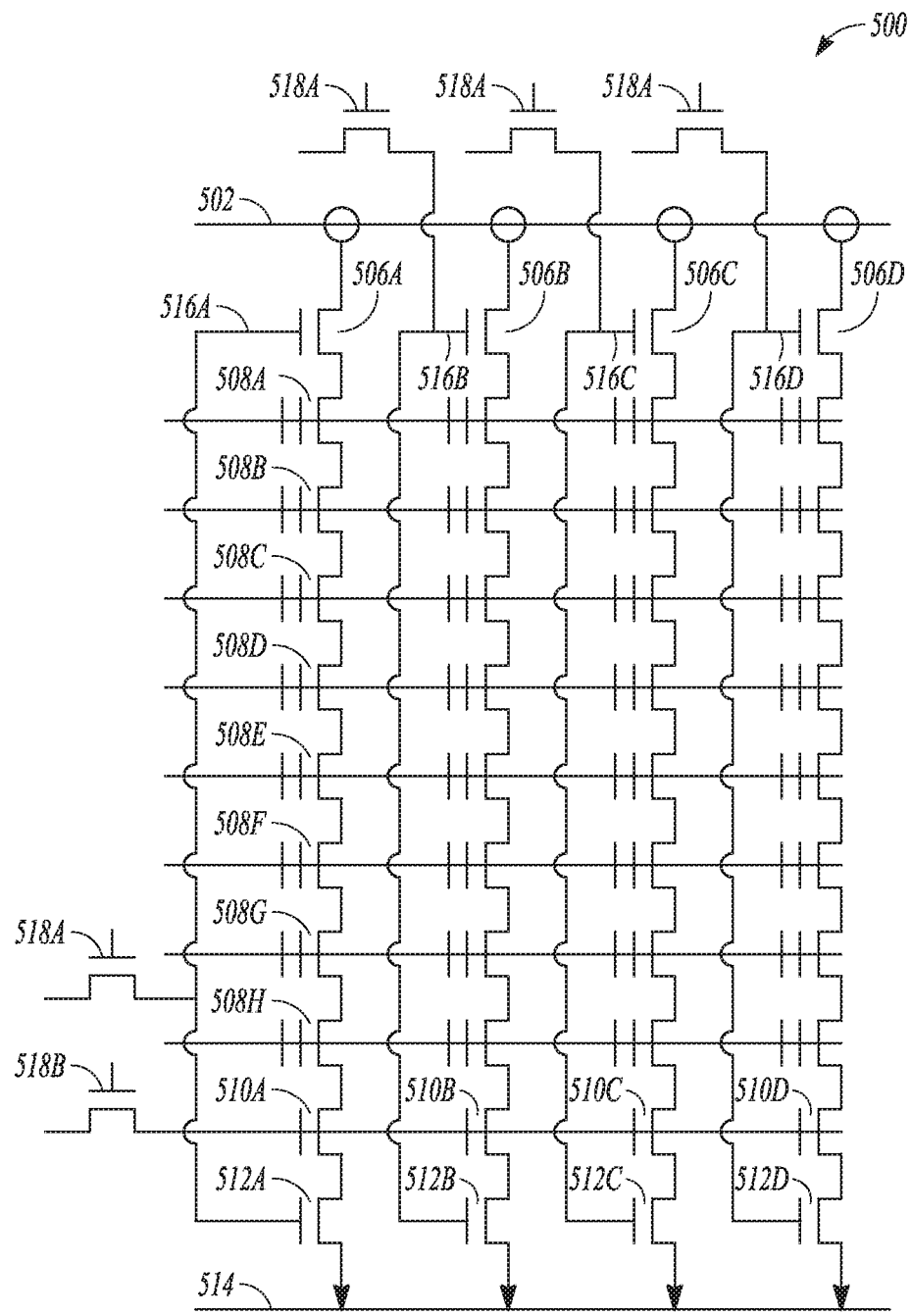
FIG. 5 shows a circuit diagram of a memory array, in accord with one or more embodiments.

FIG. 5 shows a circuit diagram 500 of a memory array, in accord with one or more embodiments. The circuit diagram 500 can be of the memory array 400A or 400B of FIGS. 4A and 4B, with the circuit diagram 500 including eight memory cells per string instead of four as shown in FIGS. 4A and 4B. The memory array of the circuit diagram 500 includes a data line 502, SGD select transistors 506A, 506B, 506C, and 506D, memory cells 508A, 508B, 508C, 508D, 508E, 508F, 508G, and 508H, SGS select transistors 510A, 510B, 510C, and 510D, SGS select transistors 512A, 512B, 512C, and 512D, and a source 514.

The SGD select transistor 506A includes a gate that can include the SGD connection 406A. The memory cell 508A includes a gate that can include the CG connection 408A. Similarly, the SGS select transistor 510A includes a gate that can include the SGS connection 410A and the SGS select transistor 512A includes a gate that can include the SGS connection 412A. The pillar 404A-G can function as a body of the select transistors and the memory cells. The source 514 can include the source 414. The data line 502 can include the data line 402A-D.

The memory array can include a plurality of strings of memory cells, each coupled between the data line 502 and the source 514. Each string can include a respective SGD select transistor 506A-D, a plurality of serially coupled memory cells 508A-H, a respective SGS select transistor 510A-D, and a respective SGS select transistor 512A-D. The strings of memory cells in FIG. 5 are arranged in a vertical string configuration.

The SGD select transistor 506A-D for each string can be coupled between a data line 502 and a memory cell 508A of the respective string. The SGS select transistor 510A-D of each string can be coupled between a memory cell 508H of the respective string and another respective SGS select transistor 512A-D of the string. Each SGS select transistor 512A-D can be coupled between a respective SGS select transistor 510A-D and a source 514.

Gates of each of the SGS select transistors 510A-D can be coupled to each other and to a drain of a drive transistor 518B. A gate of the SGD select transistor 506A-D of each string can be coupled to the gate of an SGS select transistor 512A-D of the same string, such as through a connection 516A, 516B, 516C, or 516D, respectively. The gates of the select transistors 506A-D and 512A-D, respectively, can both be coupled to a drain of a respective drive transistor 518A.

By including at least two select transistors coupled between the source 514 and the memory cell 508H for each string, and by including the connections 516A-D, the amount of leakage current during a read operation can be reduced in at least some embodiments. Also, such a configuration can provide the ability to selectively boost channels of unselected strings of memory cells, such as during programming operations.

Figure 6:
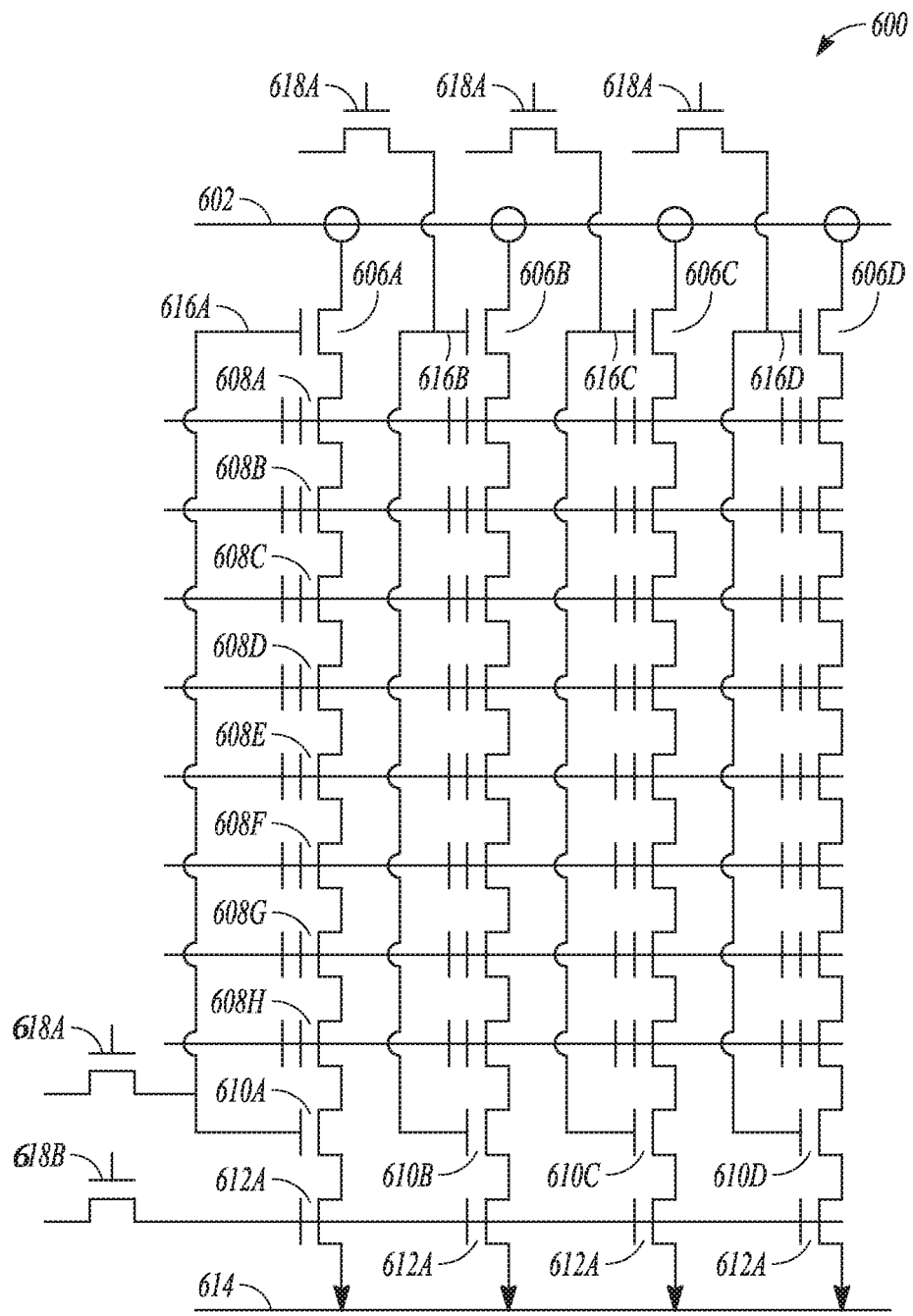
FIG. 6 shows another circuit diagram of another memory array, in accord with one or more embodiments.

FIG. 6 shows a circuit diagram 600 of a memory array, in accord with one or more embodiments. The circuit diagram 600 can be of the memory array 400A or 400C of FIGS. 4A and 4C, with the circuit diagram 600 including eight memory cells per string instead of four as shown in FIGS. 4A and 4C. The strings of memory cells depicted in FIG. 6 are arranged in a vertical string configuration.

The SGD select transistor 606A includes a gate that can include the SGD connection 406A. The memory cell 608A includes a gate that can include the CG connection 408A. Similarly, the SGS select transistor 610A includes a gate that can include the SGS connection 410A and the SGS select transistor 612A includes a gate that can include the SGS connection 412A. The pillar 404A-G can function as a body of the select transistors and the memory cells. The source 614 can include the source 414. The data line 602 can include the data line 402A-D.

A memory array configured consistent with the circuit diagram 600 of FIG. 6 can include an SGS select transistor 610A-D with a channel length (the length of the gate of the SGS select transistor 610A-D) that is shorter than the channel length of the SGS select transistor 510A. The channel length of the SGS select transistor 510A can be longer so as to handle power required during a program operation without damaging the SGS select transistor 510A. The SGS select transistor 610A-D may not need to be driven to the same high voltage potentials as the SGS select transistor 510A, and thus may include a shorter channel length, such as without the risk of damaging the SGS select transistor 610A-D.

Figure 7A:
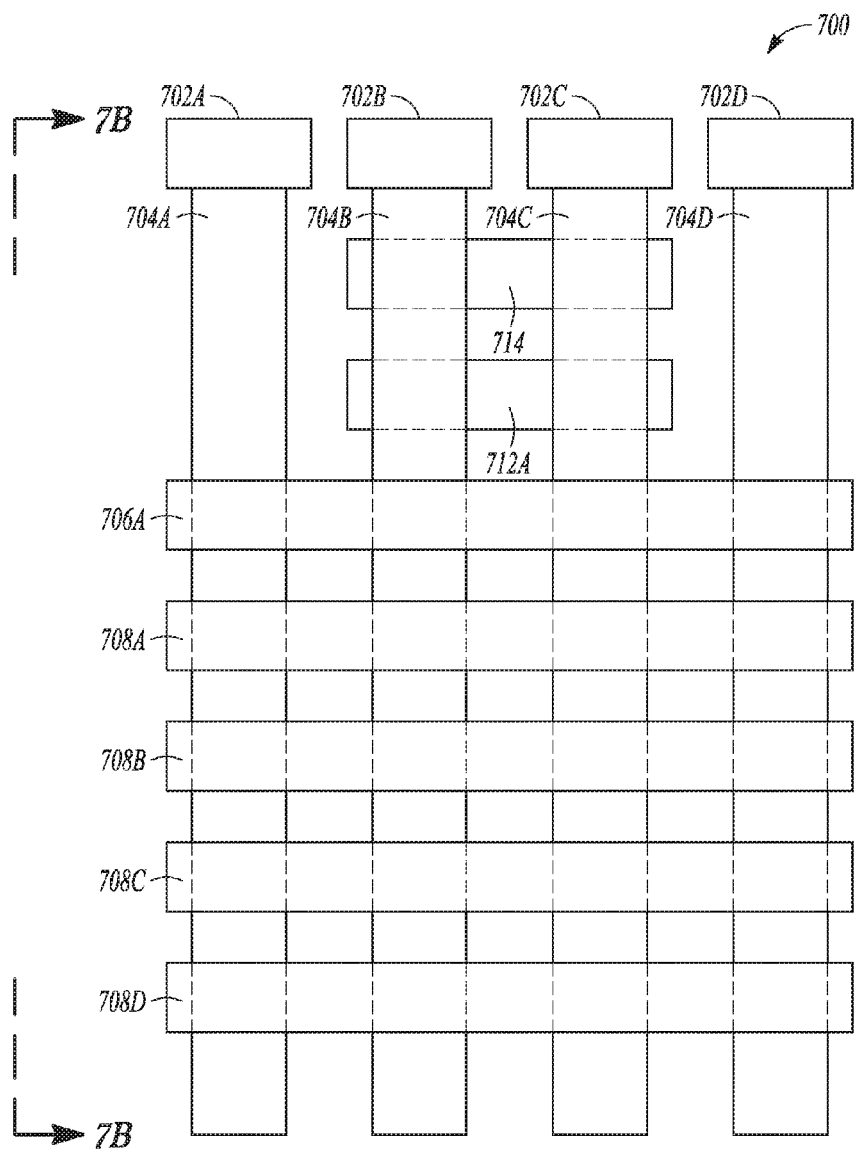
FIG. 7A shows a planar view block diagram of a u-shaped memory array, in accord with one or more embodiments.
Figure 7B:
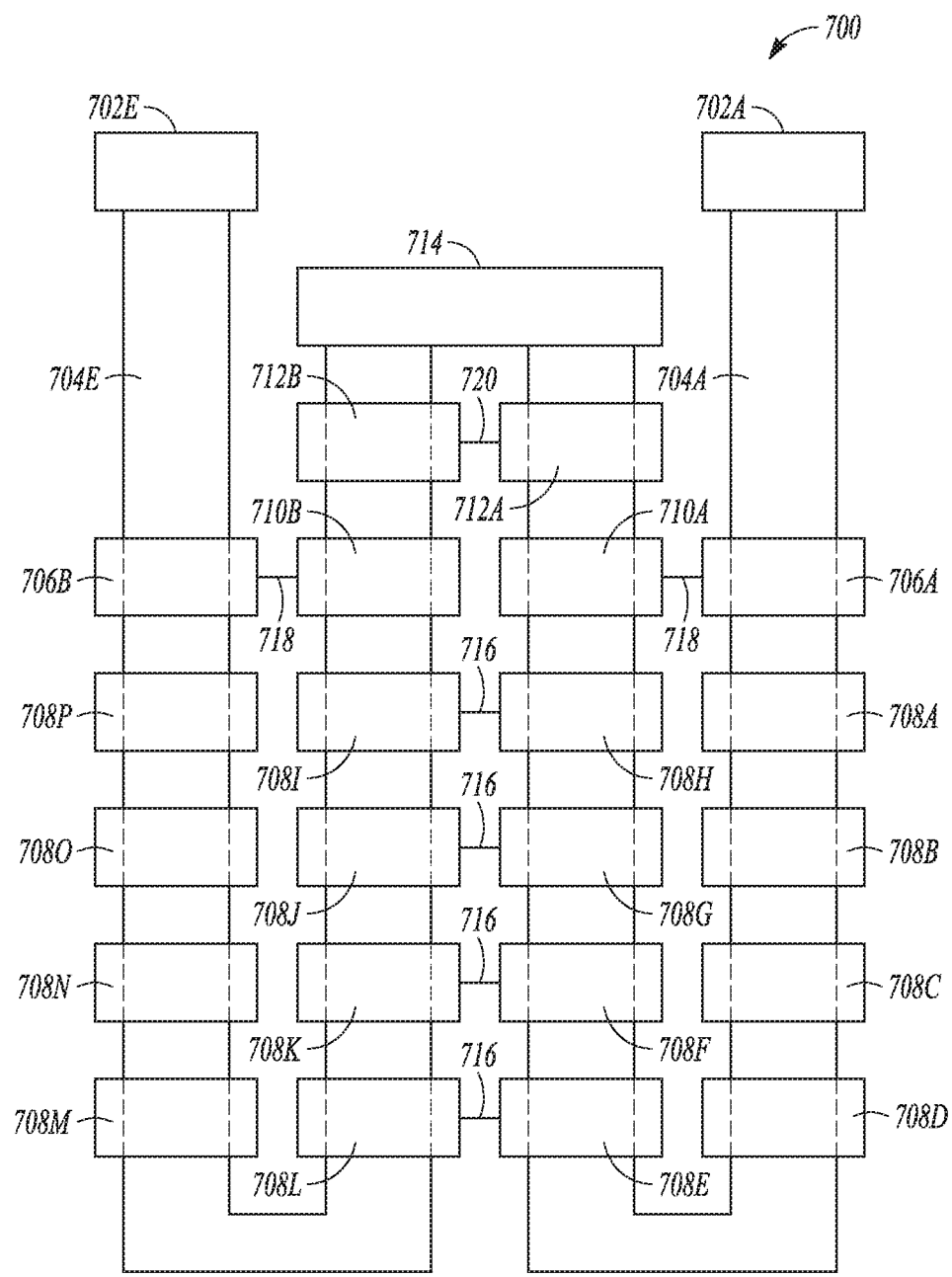
FIG. 7B shows a planar view block diagram of the memory array of FIG. 7A from the direction indicated by the lines 7B-7B in FIG. 7A, in accord with one or more embodiments.

FIG. 7A shows a planar view block diagram of a memory array 700, in accord with one or more embodiments. FIG. 7B shows a planar view block diagram of the memory array 700 of FIG. 7A, in accord with one or more embodiments. The memory array 700 can be similar to the memory arrays 400A-C of FIGS. 4A-4C with the memory array 700 configured as a U-Shaped (e.g., a Bit-Cost Scalable (BICS)) memory array.

The memory array 700 includes data lines 702A, 702B, 702C, and 702D, pillars 704A, 704B, 704C, 704D and 704E, SGD connections 706A and 706B, CG connections 708A, 708B, 708C, 708D, 708E, 708F, 708G, 708H, 708I, 708J, 708K, 708L, 708M, 708N, 708O, and 708P, SGS connections 710A and 710B, SGS connections 712A and 712B, and a source 714. The memory array 700 of FIG. 7B shows two strings of memory cells, each including a U-shaped pillar 704A, 704E, an SGD select transistor coupled to an SGD connection 706A, 706B, a plurality of serially coupled memory cells coupled to CG connections 708A-H, 708I-P, an SGS select transistor coupled to an SGS connection 710A, 710B, and an SGS select transistor coupled to an SGS connection 712A, 712B.

A data line 702A-E can be coupled to one or more pillars 704A-E. The CG connections 708E-H can be coupled to the CG connections 708I-L, such as through a respective connection 716. The connection 716 can include a conductive material such as a metal or a semiconductor. The connection 716 can include the same material as the CG connection 708A-I, such as to form two CG connections using some of the same material. Similarly, an SGD connection 706A-B can be coupled to a respective SGS connection 710A-B, such as through the connection 718. The connection 718 can include the same material as the SG connections 706A-B or 710A-B, such as to form two SG connections using some of the same material. Similarly, the SGS connections 712A and 712B can be coupled to each other, such as through the connection 720. The connection 720 can include the same material as the SGS connection 712A or 712B, such as to form two SGS connections using some of the same material.

Figure 8:
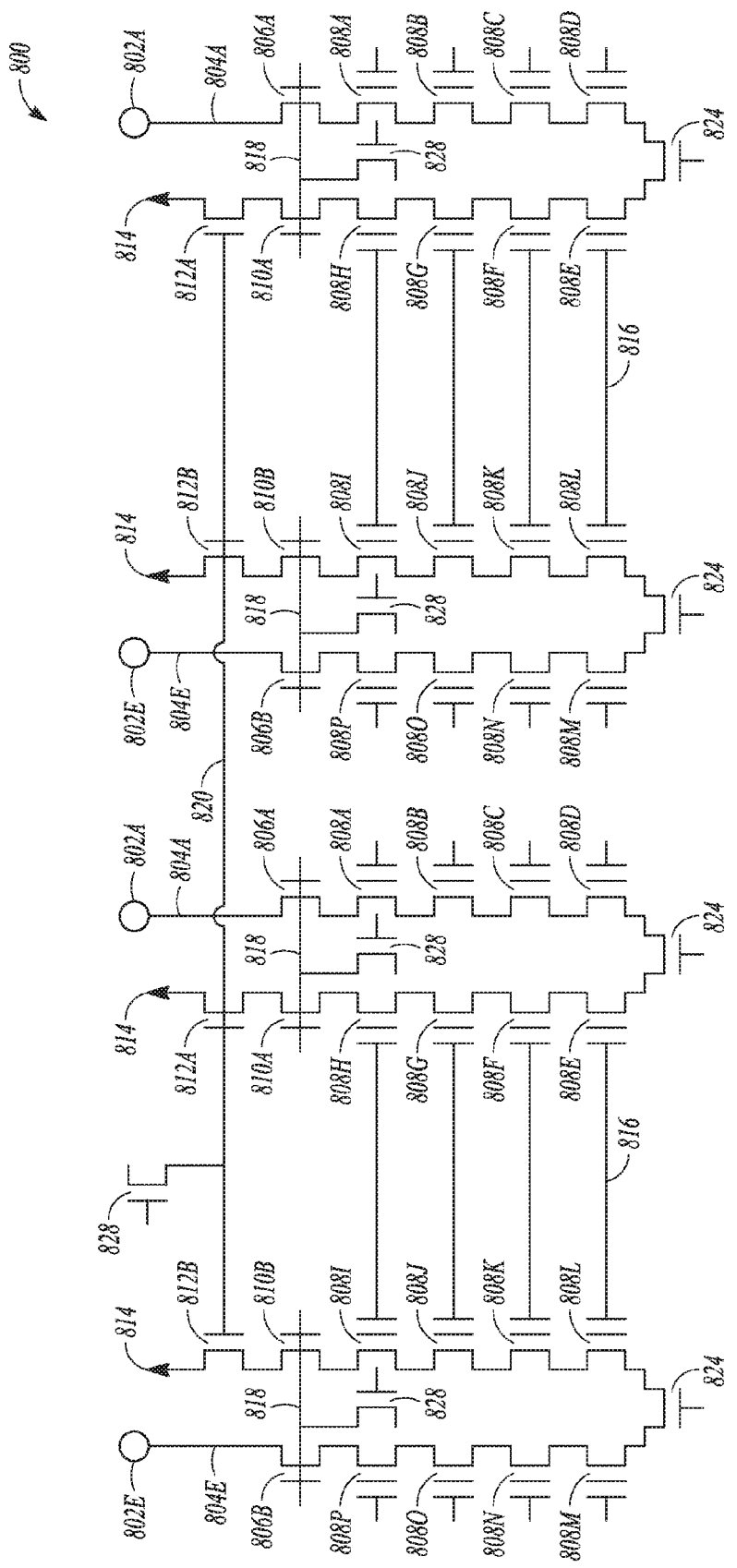
FIG. 8 shows a circuit diagram of another memory array, in accord with one or more embodiments.

FIG. 8 shows a circuit diagram 800 of a memory array that includes a configuration similar to the memory array 700, in accord with one or more embodiments. The circuit diagram 800 shows four strings of memory cells while the memory array 700 shown in FIG. 7B only shows two strings of memory cells.

The SGD select transistor 806A includes a gate that can include the SGD connection 706A. The memory cell 808A includes a gate that can include the CG connection 708A. Similarly, the SGS select transistor 810A includes a gate that can include the SGS connection 710A and the SGS select transistor 812A includes a gate that can include the SGS connection 712A. The channels 804A-G can be formed in the pillars 704A-G. The source 814 can include the source 714. The data line 802A, 802E can include the data line 702A, 702E, respectively.

The strings of memory cells shown in the circuit diagram 800 include an SGD select transistor 806A or 806B coupled between a data line 802A or 802E, respectively, and a memory cell 808A or 808P, respectively. A plurality of memory cells 808A-H or 808I-P can be serially coupled to one another. A pass transistor 824 can be coupled between groups of memory cells 808A-D and 808E-H (or groups 808I-L and 808M-P) of the string (e.g., between memory cells 808D and 808E or 808L and 808M as shown in FIG. 8).

An SGS select transistor 810A-B is coupled between the memory cell 808H-I, respectively, and another SGS select transistor 812A-B, respectively. The SGS select transistor 812A-B is coupled between the SGS select transistor 810A-B, respectively, and the source 814.

The SGD select transistor 806A-B can include a gate coupled to the gate of the SGS select transistor 810A-B, respectively, such as through a connection 818. By including such a connection, the number of drive transistors 828 can be reduced as compared to a memory array that does not include a second select transistor coupled between the source 814 and a memory cell 808A or 808I.

In a P-BICS (a Piped Shaped BICS) memory architecture, such as that shown and described in "Disturbless Flash Memory due to High Boost Efficiency on BiCS Structure and Optimal Memory Film Stack for Ultra High Density Storage Device," in *IEDM Tech. Dig.*, 2008, pp. 851-854, authored by Komori et al., the number of SG drive transistors required is 32 (for a P-BICS with 16 strings of memory cells), 16 for the SGD select transistors between the data line and the memory cells and another sixteen for the SGS select transistors between the source and the memory cells. In contrast, a memory array arranged according to the circuit diagram 800 that includes 16 strings of memory cells can be driven using 17 drive transistors: one per string to drive both a SGD select transistor 806A and a SGS select transistor 810A (or both 806B and 810B) for a respective string (for a total of 16 drive transistors) and one drive transistor to drive SGS select transistors 812A-B. Thus, a significant reduction in the number of drive transistors can be realized using the memory array 700 or a memory array configured according to the circuit diagram 800.

Figure 9A:
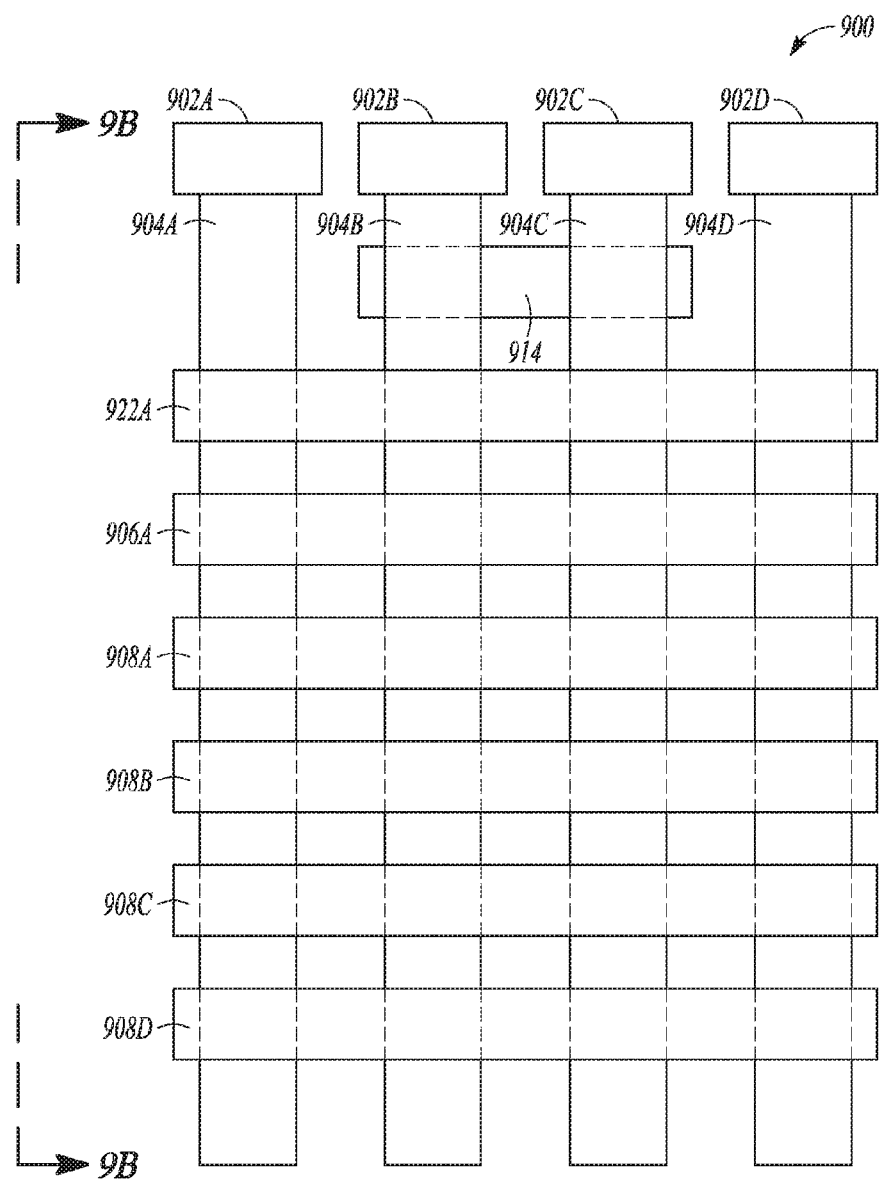
FIG. 9A shows a planar view block diagram of a memory array, in accord with one or more embodiments.
Figure 9B:
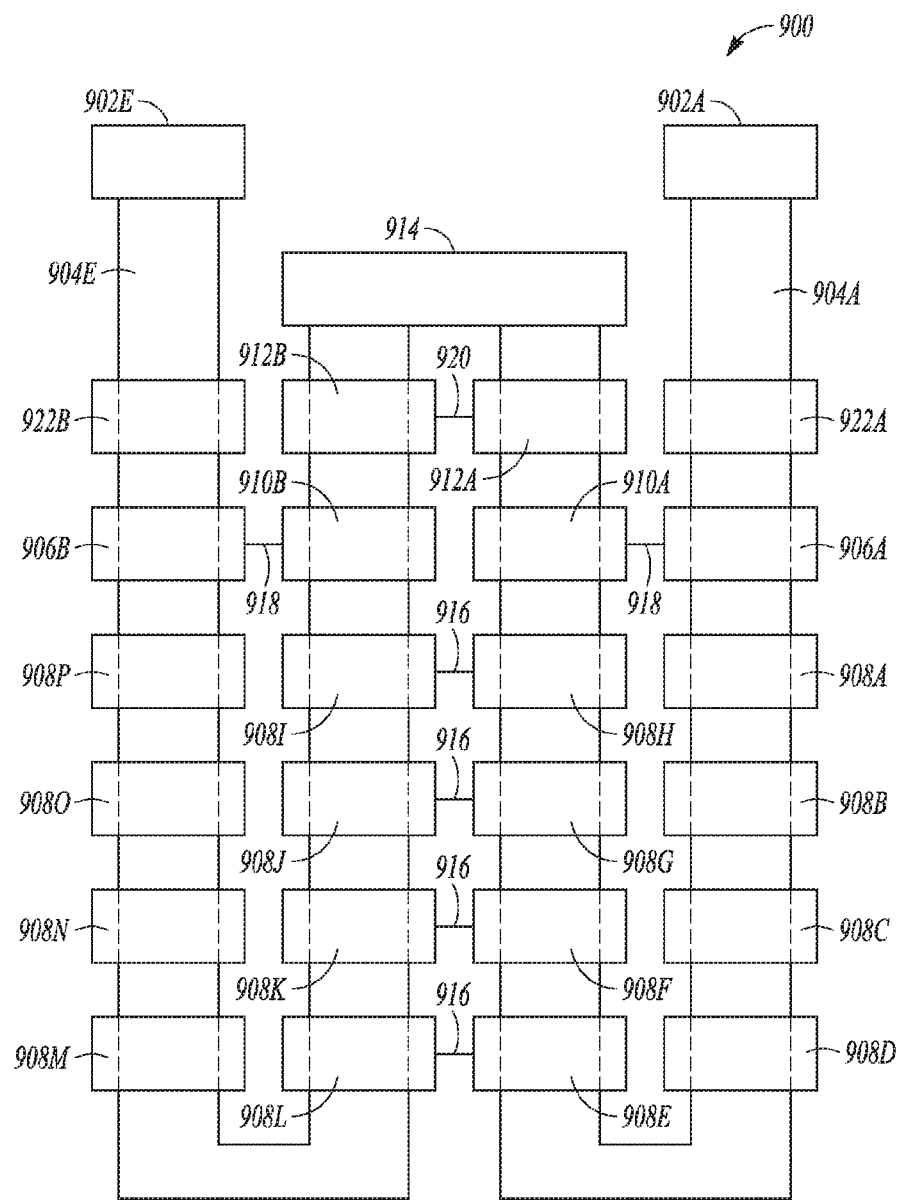
FIG. 9B shows a planar view block diagram of the memory array of FIG. 9B from the direction indicated by the lines 9B-9B in FIG. 9A, in accord with one or more embodiments.

FIG. 9A shows a planar view block diagram of a memory array 900, in accord with one or more embodiments. FIG. 9B shows a planar view block diagram of the memory array 900 of FIG. 9A, in accord with one or more embodiments. The memory array 900 can be similar to the memory array 700 of FIGS. 7A and 7B with the memory array 900 including a second SGD connection 922A or 922B between the data line 902A or 902E and the CG connection 908A or 908P, respectively.

The memory array 900 can include data lines 902A, 902B, 902C, 902D, and 902E, pillars 904A, 904B, 904C, 904D, and 904E, SGD connections 906A and 906B, CG connections 908A, 908B, 908C, 908D, 908E, 908F, 908G, 908H, 908I, 908J, 908K, 908L, 908M, 908N, 908O, and 908P, SGS connections 910A and 910B, SGS connections 912A and 912B, and a source 914. The memory array 900 of FIG. 9B shows two strings of memory cells. Each string can include a U-shaped pillar 904A-E, a first SGD select transistor coupled to a first SGD connection 922A-B, a second SGD select transistor coupled to a second SGD connection 906A-B, a plurality of memory cells coupled to CG connections 908A-P, a first SGS select transistor coupled to a first SGS connection 910A-B, and a second SGS select transistor coupled to a second SGS connection 912A-B.

A data line 902A-E can be coupled to one or more pillars 904A-E. Each CG connection of a subset of CG connections 908E-H can be coupled to a respective CG connection of a corresponding subset of CG connections 908I-L, such as through the connections 916. The connections 916 can include a conductive material such as a metal or a semiconductor. The connections 916 can include the same material as the CG connections 908E-L, such as to form two CG connections using some of the same material. Similarly, the SGD connection 906A-B can be coupled to a respective SGS connection 910A-B, such as through the connection 918. The connection 918 can include the same material as the SG connection 906A-B or 910A-B, such as to form two SG connections using some of the same material. Similarly, the SGS connections 912A and 912B can be coupled to each other, such as through the connection 920. The connection 920 can include the same material as the SGS connection 912A or 912B, such as to form a connection between two SGS connections using some of the same material.

The memory array 900 can include SGD connections 922A-B. The SGD connections 922A-B can be between the data lines 902A and 902E and the SGD connections 906A and 906B, respectively, such as shown in FIG. 9A or 9B.

Figure 10:
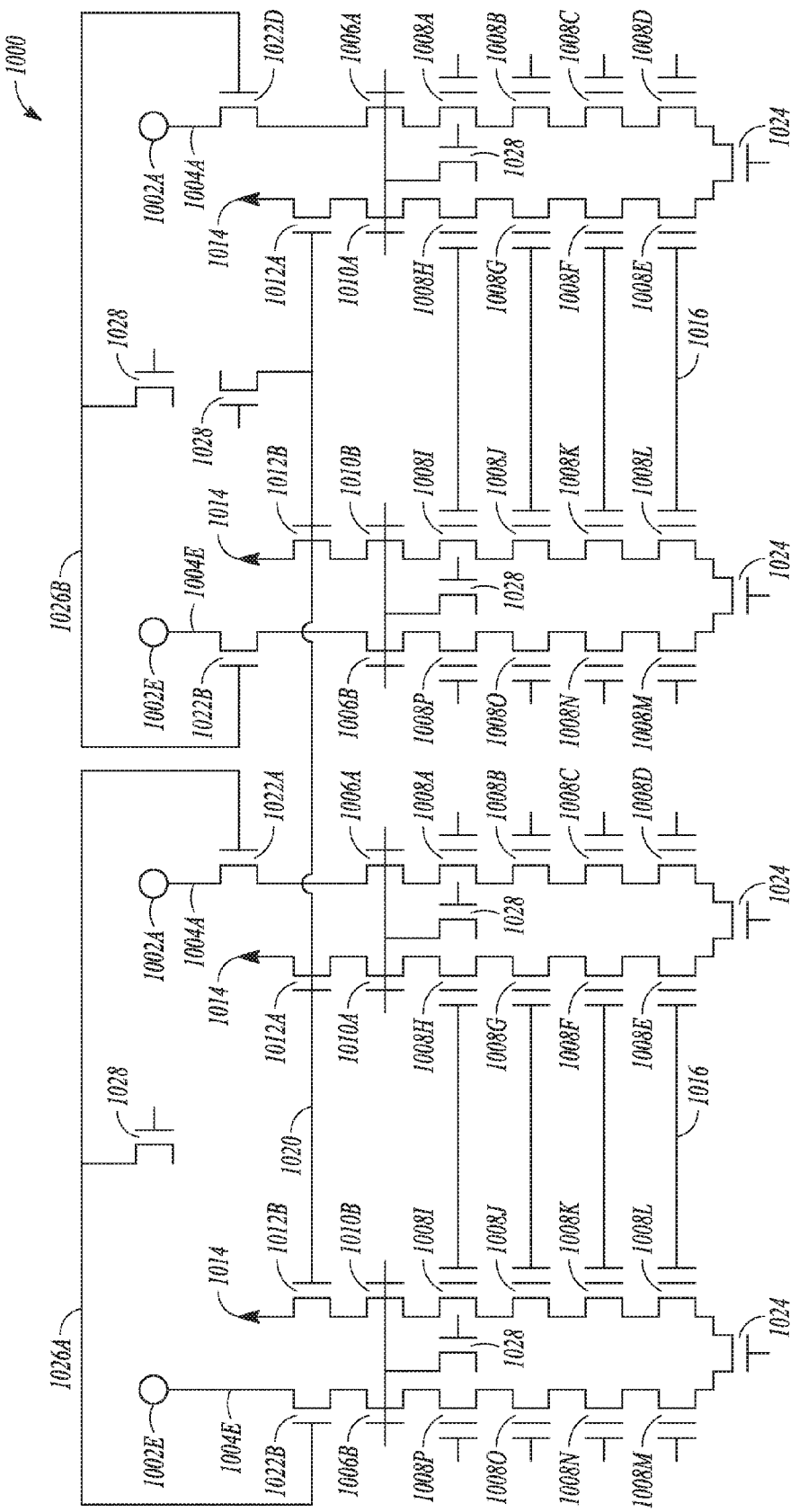
FIG. 10 shows a circuit diagram of another memory array, in accord with one or more embodiments.

FIG. 10 shows a circuit diagram 1000 of a memory array that is configured similar to the memory array 900, in accord with one or more embodiments. The circuit diagram 1000 shows four strings of memory cells, while the memory array 900 depicted in FIG. 9A or 9B only shows two strings of memory cells. A string of memory cells configured in accord with the circuit diagram 1000 can include two SGD select transistors (e.g., an SGD select transistor 1006A-B and an SGD select transistor 1022A-B) coupled between a data line 1002A and 1002E and a memory cell 1008A and 1008P, respectively.

The SGD select transistor 1006A of a string includes a gate that can include the SGD connection 906A. The memory cell 1008A of the string include gates that can include the CG connection 908A Similarly, the SGS select transistor 1010A includes a gate that can include the SGS connection 910A and the SGS select transistor 1012A includes a gate that can include the SGS connection 912A. A channel 1004 can be formed in the pillar 904. The source 1014 can include the source 914. The data line 1002A can include the data line 902A.

A string of memory cells in the circuit diagram 1000 can include a SGD select transistor 1022A-B coupled between a SGD select transistor 1006A-B and a data line 1002A and 1002E, respectively. The SGD select transistor 1006A-B can be coupled between the SGD select transistor 1022A-B and a memory cell 1008A and 1008P, respectively. A plurality of memory cells 1008A-H and 1008I-P can be coupled in series between the SGD select transistor 1006A-B and an SGS select transistor 1010A-B, respectively. A pass transistor 1024 can be coupled between two groups of the memory cells of a string, such as shown in FIG. 10.

The SGS select transistor 1010A-B can be coupled between a memory cell 1008H-I and another SGS select transistor 1012A-B, respectively. The SGS select transistor 1012A-B can be coupled between the SGS select transistor 1010A-B, respectively, and the source 1014.

The SGD select transistor 1006A-B of a string can include a gate coupled to the gate of the SGS select transistor 1010A-B of the string, such as through a connection 1018. The SGD select transistor 1022A-B of a string can include a gate coupled to a gate of the SGD select transistor 1022A-B of another string, such as through a SGD connection 1026. By including the SGD connection 1026 and the SGD select transistor 1022A-B, the number of SG drive transistors 1028 can be reduced as compared to a memory array that does not include a second select transistor coupled between the data line and the memory cell. The number of drive transistors 1028 required to drive a memory array configured in accord with the circuit diagram 1000 that includes sixteen strings of memory cells (two sets of eight strings of memory cells that mirror each other and include some of the same drive transistors) can be eleven as follows: 1) one for each SGD select transistor 1006A-B, which also serves as a driver for the SGS select transistor 1010A-B that is coupled to the SGD select transistor 1006A-B for a total of eight drive transistors; 2) one drive transistor for each half of the SGD select transistors 1022A-B for a total of two drive transistors; and 3) one drive transistor to drive the SGS select transistors 1012A-B of all sixteen strings of memory strings. See the discussion with regard to FIG. 8 for the number of drive transistors required for similar circuits.

Figures 11, 12:
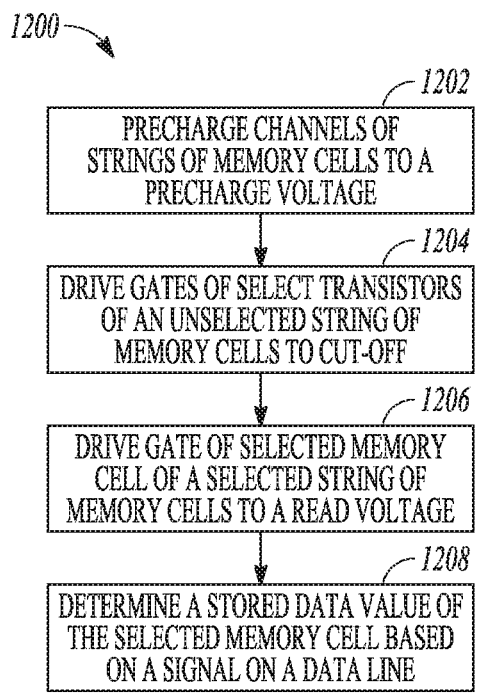
FIG. 11 shows a table of decoder logic states, in accord with one or more embodiments.
FIG. 12 shows a flow diagram of a method of performing a read operation, in accord with one or more embodiments.

FIG. 11 shows a table 1100 of decoder logic states, in accord with one or more embodiments. The table 1100 depicts, by way of example, how a decoder (e.g., decoder 308) can determine which drive transistors to activate to perform an access (e.g., a read or program) operation on a desired string. According to the table 1100, to access string "1", for example, DT0 (drive transistor "0") would be activated (e.g., to activate both the select transistors 1006B and 1010B), DT2 would be activated (e.g., to activate both the SGD select transistors 1022A and 1022B), and DT4 would be activated (e.g., to activate the SGS select transistors 1012A-B). Accordingly, a decoder can cause a unique set of DT states to, for example, read or program a particular memory cell or string of memory cells.

FIG. 12 shows a flow diagram of a method 1200 of performing a read operation using a memory array that includes at least two select transistors coupled between a source and a memory cell of a string (e.g., a memory array configured in accord with the circuit diagram 500, 600, 800, or 1000), in accord with one or more embodiments. The method 1200 as illustrated includes: at operation 1202, precharging channels of strings of memory cells (of a selected block of memory cells) to a precharge voltage; at operation 1204, driving gates of select transistors of an unselected string of memory cells to cut-off; at operation 1206, driving a control gate of a selected memory cell to a read voltage; and at operation 1208, determining the stored data value of a memory cell based on a signal (e.g., a voltage or current signal) on a data line.

The operation at 1202 can include precharging (e.g., boosting) the channels of a selected block (e.g., one or more memory cells) through data lines. A data line can be coupled to the memory cells of a respective string by activating a corresponding SGD select transistor(s). The operation at 1204 can include driving control gates of a plurality of select transistors of an unselected string of memory cells to a reference voltage (e.g., $V_{ss}$) to inactivate the unselected select transistors, thereby cutting off the channel of the unselected string of memory cells.

The method 1200 can also include driving control gates of unselected memory cells of a string to a read_pass voltage greater than the read voltage. The method 1200 can further include driving a source to the reference voltage. Also, the method 1200 can include driving gates of the select transistors of a selected string(s) to a voltage sufficient to activate the select transistors (e.g., $V_{cc}$) of the selected string in response to (e.g., after or shortly after, such as on the order of nanoseconds) the control gate of the selected memory cell being driven to the read voltage.

FIG. 13A shows a wave diagram of a read operation 1300A using a memory array, such as the memory array 300A, 300B, the memory array 400A-C, 700, or 900, or a memory array configured in accordance with the circuit diagram 500, 600, 800, or 1000, in accord with one or more embodiments. While FIG. 13A illustrates reference numbers of FIG. 7, it will be understood that the waveforms illustrated show a general read waveform for a selected block of memory cells having strings that include at least two select transistors coupled between the source and a memory cell. The waveform of FIG. 13A can depict some aspects of the method 1200.

Pillars of a selected block can be driven from corresponding data lines so as to precharge the channels of the memory cells of the selected block. The channels of unselected strings of the block can be driven to float, such as by driving the control gate of the SGD select transistor (e.g., 706B) and the commonly coupled control gate of one of the SGS select transistor (e.g., 710B) of each unselected string to a reference voltage (e.g., $V_{ss}$ or other reference voltage), so that the channels of the unselected strings can be cut-off during data line sensing. According to at least one of the disclosed embodiments, as a result, the leakage current through the SGD select transistors of the unselected strings can be at least partially suppressed. The channels of the unselected strings can be boosted by the CGs of the selected block, such as when they are driven to a pass read and/or read voltage (e.g., a $V_{pass\_read}$ or $V_{read}$, such as shown in FIG. 13A). An advantage of performing such an operation, in accord with at least one of the disclosed embodiments, can include reduced read disturbance.

FIG. 13B shows a wave diagram of another read operation 1300B using a memory array, such as the memory array 300A, 300B, the memory array 400A-C, 700, or 900, or a memory array configured in accord with the circuit diagram 500, 600, 800, or 1000, in accord with one or more embodiments. While FIG. 13B illustrates reference numbers of FIG. 7, it will be understood that the waveforms illustrated show a general read waveform for a selected block of memory cells including strings having two select transistors coupled between the source and a memory cell. The waveform of FIG. 13B can depict some aspects of the method 1200.

Pillars of a selected block can be driven from the data lines of the selected block so as to precharge the channels of memory cells of the selected block. The channels of unselected strings of the block can be driven to float, such as by applying a reference voltage (e.g., $V_{ss}$) to the control gates of SGD and SGS select transistors of the unselected strings, so that the channels of the unselected strings can be cut-off during data line sensing. According to at least one of the disclosed embodiments, as a result, the leakage current through the unselected SGD select transistors can be suppressed. The unselected pillar channels can be boosted by the CGs, such as through application of a voltage to such CGs (e.g., a $V_{pass\_read}$ or $V_{read}$, such as shown in FIG. 13B). An advantage of performing such an operation, in accord with at least one of the disclosed embodiments, can include reduced read disturbance.

Some differences between the wave diagram 1300A and the wave diagram 1300B include not temporarily reducing the voltages on the CGs of the memory cells and selected SGD select transistors after driving those gates to a voltage higher than $V_{ss}$ (e.g., $V_{cc}$). For example, as shown in FIG. 13B, the CGs of the memory cells of the selected block are driven to $V_{pass\_read}$ instead of $V_{cc}$, after which the voltage on the CG of the selected memory cell is reduced to $V_{read}$. Also, the voltage on the gate of the SGD select transistor(s) of the selected string is maintained at $V_{cc}$ instead of temporarily reducing it to $V_{ss}$. An advantage of performing an embodiment such as that discussed with respect to FIG. 13B may be realized in circumstances where the threshold voltage of the cell selected to be read is higher than $V_{cc}$ (where performing an embodiment such as that discussed with respect to FIG. 13A may lead to the channel of the selected cell not being sufficiently precharged).

Figure 14:
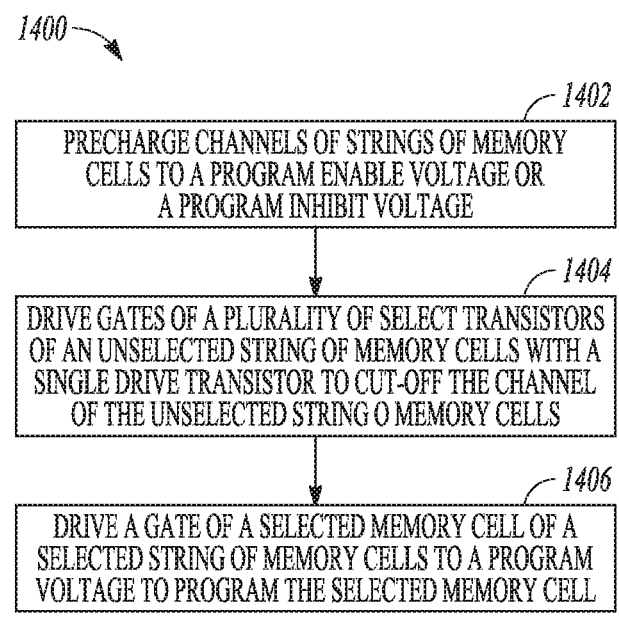
FIG. 14 shows a flow diagram of a method of performing a program operation, in accord with one or more embodiments.

FIG. 14 shows a flow diagram of a method 1400 of performing a program operation on a selected block of memory array that includes strings having at least two select transistors coupled between a source and a memory cell (e.g., memory array 300A or 300B or memory array 400A-C, 700, or 900 or a memory array configured in accordance with the circuit diagram 500, 600, 800, or 1000), in accord with one or more embodiments. The method 1400 as illustrated includes: at operation 1402, selectively precharging channels of memory cells to a voltage selected from the group comprising at least one of a program enable voltage (e.g., $V_{ss}$ or ground) and a program inhibit voltage (e.g., $V_{cc}$) or other voltage intermediate to the program inhibit voltage and the program enable voltage, such as a Selective Slow Programming Convergence (SSPC) voltage; at operation 1404, driving gates of a plurality of select transistors of an unselected string of memory cells with a single drive transistor to cut-off the channel of the unselected string of memory cells; and, at operation 1406, driving a gate of a selected memory cell of a selected string of memory cells to a program voltage to program the selected memory cell.

SSPC can account for preexisting charges present on a given connection. SSPC can be used when programming a memory cell or block of memory cells. Using SSPC, a memory cell is programmed with incrementally increased programming pulses applied to CG connections to which the memory cell is coupled. After each pulse, a verify operation can help determine the threshold voltage for the cell. When the threshold voltage reaches a pre-verify threshold, the data connected to that particular cell can be biased with an intermediate voltage that slows down the change in the threshold voltage of the cell. Other memory cells can continue to be programmed at their normal pace. As the threshold voltage for each cell reaches the pre-verify level, it is biased with the intermediate voltage. The data lines can be biased with an inhibit voltage as the cell threshold voltage reaches the verify voltage threshold.

The operation at 1402 can include precharging the channels through data lines. The data lines can be coupled to the channels of a block of memory cells by activation of the SGD select transistors. The program voltage (e.g., $V_{program}$) can be greater than both the program enable and program inhibit voltages.

The method 1400 can also include driving CGs of unselected memory cells of the strings to a pass_program voltage less than the program voltage. The method 1400 can further include driving a source from a first reference voltage (e.g., $V_{ss}$) to a second reference voltage (e.g., $V_{cc}$) prior to driving the control gates of the memory cells to the pass_program voltage.

Figure 15:
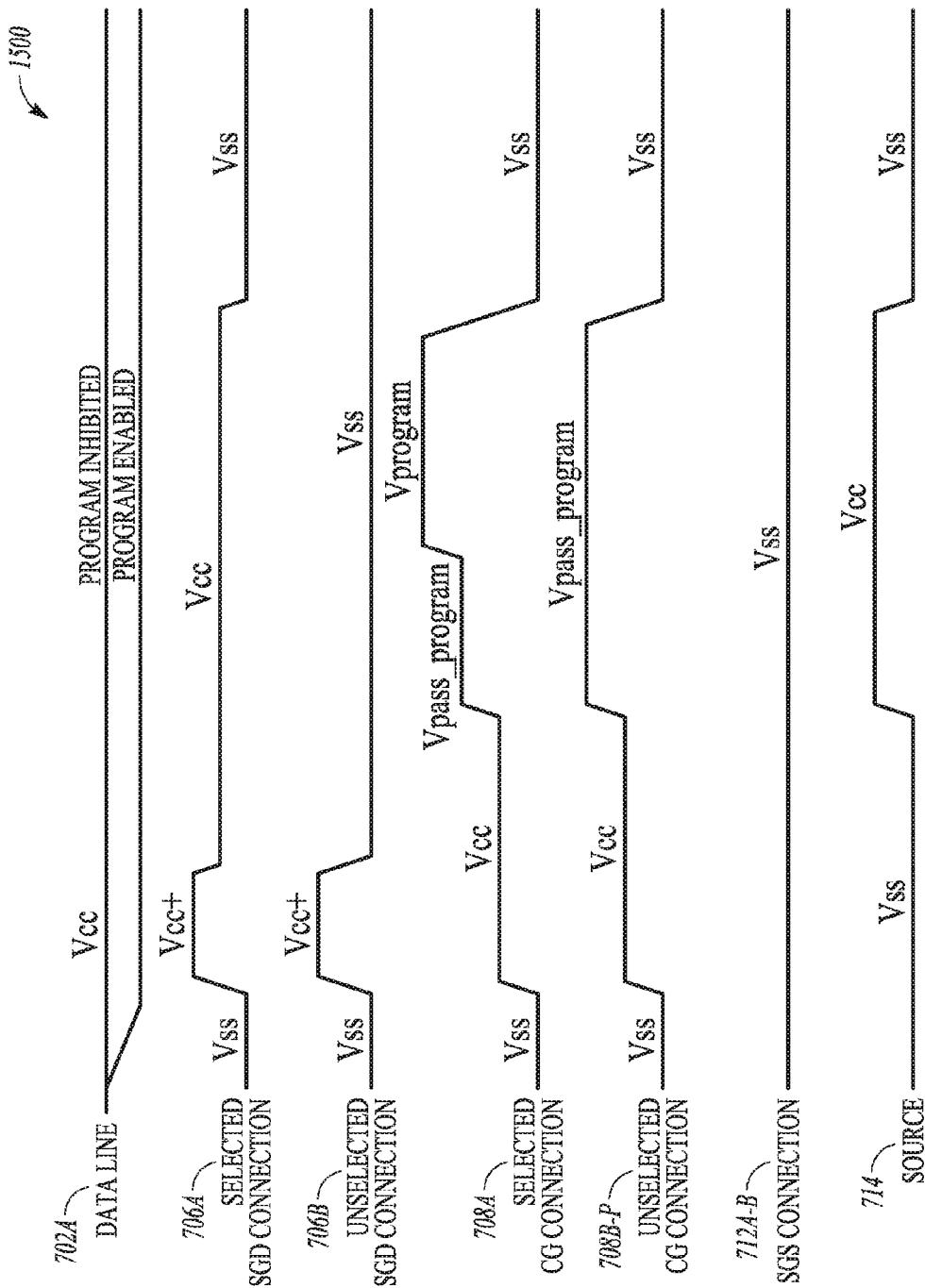
FIG. 15 shows a waveform of a program operation, in accord with one or more embodiments.

FIG. 15 shows a wave diagram of a program operation 1500 using a memory array, such as the memory array 300A, 300B, the memory array 400, 700, or 900, or a memory array configured in accord with the circuit diagram 500, 600, 800, or 1000, in accord with one or more embodiments. While FIG. 15 illustrates reference numbers of FIG. 7, it will be understood that the waveforms illustrated show a general program waveform for a selected block of a memory array including two select transistors coupled between the source and a memory cell. The channels of the selected block can be driven from the data lines so as to selectively precharge channels of memory cells of the selected block. SGD and SGS select transistors of the unselected strings can then be cut-off to allow the channels of the unselected strings of memory cells to float during programming. The waveform of FIG. 15 can depict some aspects of the method 1400.

An advantage of using a string of memory cells as discussed herein can include not increasing the number of drive transistors required to drive select transistors of the string of memory cells while maintaining or increasing channel selectivity. The leakage current through unselected channels can be reduced so that a number of faulty read operations can be reduced. For example, the read disturbance or the leakage current can be reduced. An advantage can include a read power reduction, such as in embodiments where the unselected channels can be floating. Similarly, a time to perform a read or program operation can be reduced, such as in embodiments where unselected channels can be floating.

While the above description and drawings illustrate some embodiments of strings of memory cells using n-type logic, it will be understood that p-type logic could be used in creating such strings of memory cells. Also, while the above description and drawings illustrate some strings of memory cells with certain numbers of memory cells, it will be understood that more or fewer memory cells can be included in a string of memory cells. Typically, the number of memory cells in a string is a power of two, such as two, four, eight, sixteen, thirty-two, sixty-four, etc., but different numbers of memory cells can be included in a string. The number of strings of memory cells in a block of memory can likewise be increased or decreased. An apparatus or device, as described herein, can refer to any of a system, device, die, circuit, or the like.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description.

What is claimed is:

1. An apparatus comprising:
   a plurality of semiconductor pillars situated in a grid, the grid of pillars including rows and columns of pillars;
   a plurality of select gate drain connections situated around the pillars;
   a plurality of semiconductor control gate connections situated around the pillars below the select gate drain connections,
   a plurality of first select gate source connections situated around the pillars below the control gate connection;
   a plurality of second select gate source connections situated around the pillars below the first select gate source connections; and
   a drive transistor having a drain coupled to both:
      the plurality of select gate drain connections; and
      the plurality of first select gate source connections or the plurality of second select gate source connections.

2. The apparatus of claim 1, further comprising:
   a plurality of semiconductor data lines, each data line of the data lines connected to a first end of each pillar in a column of pillars of the columns of pillars.

3. The apparatus of claim 2, further comprising:
   a source connected to each of the semiconductor pillars at a second end of the semiconductor pillars, the second end opposite the first end.

4. The apparatus of claim 1, wherein each select gate drain connection of the select gate drain connections is around each pillar in a row of pillars of the rows of pillars.

5. The apparatus of claim 1, further comprising a dielectric material between each of the select gate drain connections and the pillar.

6. The apparatus of claim 1, wherein each control gate connection of the control gate connections is around each pillar in the grid of pillars.

7. The apparatus of claim 1, further comprising a semiconductor material between each of the control gate connections and each of the pillars, the semiconductor material separated from each of the pillars by a first dielectric material.

8. The apparatus of claim 7, wherein the semiconductor material is separated from each of the control gate connections by a second dielectric material.

9. The apparatus of claim 1, wherein the drive transistor is coupled to both the plurality of select gate drain connections and the plurality of first select gate source connections.

10. The apparatus of claim 1, wherein the drive transistor is coupled to both the plurality of select gate drain connections and the plurality of second select gate source connections.

11. An apparatus comprising:
    a plurality of U-shaped semiconductor pillars situated in a grid, the grid of pillars including rows and columns of pillars, each pillar of the U-shaped pillars including a first leg and a second leg with second legs of directly adjacent pillars next to each other;
    a plurality of select gate drain connections situated around the first legs of the pillars;
    a plurality of first semiconductor control gate connections situated around the first legs of the pillars below the select gate drain connections;
    a plurality of first select gate source connections situated around the second legs of the pillars;
    a plurality of second select gate source connections situated around the second legs of the pillars below the first select gate source connections;
    a plurality of second semiconductor control gate connections situated around the second legs of the pillars below the second select gate source connections; and
    a drive transistor having a drain coupled to both:
       the plurality of select gate drain connections; and
       the plurality of first select gate source connections or the plurality of second select gate source connections.

12. The apparatus of claim 11, further comprising:
    a plurality of semiconductor data lines, each data line of the data lines connected to a first end of each first leg of each pillar above the plurality of select gate drain connections.

13. The apparatus of claim 12, further comprising:
a source connected to a first end of each second leg of each of the semiconductor pillars, the source connected to the second legs above the plurality of first select gate source connections.

14. The apparatus of claim 11, wherein each select gate drain connection of the select gate drain connections is around each pillar in a row of pillars of the grid of pillars.

15. The apparatus of claim 11, further comprising a dielectric material between each of the select gate drain connections and the pillar.

16. The apparatus of claim 11, wherein each control gate connection of the control gate connections is around each pillar in a row of pillars in the grid of pillars.

17. The apparatus of claim 11, further comprising a semiconductor material between each of the control gate connections and each of the pillars, the semiconductor material separated from each of the pillars by a first dielectric material.

18. The apparatus of claim 17, wherein the semiconductor material is separated from each of the control gate connections by a second dielectric material.

19. The apparatus of claim 11, wherein the drive transistor is coupled to both the plurality of select gate drain connections and the plurality of first select gate source connections.

20. The apparatus of claim 11, wherein the drive transistor is coupled to both the plurality of select gate drain connections and the plurality of second select gate source connections.

* * * * *